United States Patent
Chow et al.

(10) Patent No.: US 12,196,423 B2
(45) Date of Patent: Jan. 14, 2025

(54) METHODS AND SYSTEMS FOR OPEN-LOOP IGNITION OF A SMOKE GENERATOR FUEL SOURCE

(71) Applicant: SharkNinja Operating LLC, Needham, MA (US)

(72) Inventors: Nicholas Chow, Boston, MA (US); Blake Hishmeh, Cambridge, MA (US); Christopher T. Martin, North Attleboro, MA (US)

(73) Assignee: SharkNinja Operating LLC, Needham, MA (US)

( * ) Notice: Subject to any disclaimer, the term of this patent is extended or adjusted under 35 U.S.C. 154(b) by 0 days.

(21) Appl. No.: 18/364,034

(22) Filed: Aug. 2, 2023

(65) Prior Publication Data
US 2023/0375178 A1    Nov. 23, 2023

Related U.S. Application Data

(63) Continuation of application No. 17/663,582, filed on May 16, 2022, now Pat. No. 11,732,895.

(51) Int. Cl.
*F24B 1/02*      (2006.01)
*A23B 4/052*    (2006.01)
(Continued)

(52) U.S. Cl.
CPC .............. *F24B 1/028* (2013.01); *A23B 4/052* (2013.01); *A47J 36/32* (2013.01); *A47J 37/0786* (2013.01);
(Continued)

(58) Field of Classification Search
CPC .......... F24B 1/028; H02P 29/40; A23B 4/052; A47J 37/0704
(Continued)

(56) References Cited

U.S. PATENT DOCUMENTS 6,868,777 B1    3/2005   Higgins et al.
7,426,885 B2    9/2008   Mclemore et al.
(Continued)

FOREIGN PATENT DOCUMENTS

AU    2016297715 A1    3/2017
AU    2016216635 A1    5/2017
(Continued)

OTHER PUBLICATIONS

International Search Report and Written Opinion Received for PCT Patent Application No. PCT/US2023/066807, mailed on Sep. 13, 2023, 9 pages.

*Primary Examiner* — Nathaniel E Wiehe
*Assistant Examiner* — Thomas J Ward
(74) *Attorney, Agent, or Firm* — Mintz, Levin, Cohn, Ferris, Glovsky and Popeo, P.C.

(57) ABSTRACT

In an aspect, data characterizing an instruction for an activation of an igniter and an operating mode of a smoke generator that includes the igniter can be received. A first amount of energy required for an ignition of a fuel source by the igniter can be determined based on the operating mode characterized by the received data. The igniter can be caused to activate based on the received data. A second amount of energy, output by the igniter over a period of time during which the igniter is activated, can be determined. A determination of whether the second amount of energy exceeds the first amount of energy can be made. The igniter can be caused to deactivate in response to a determination that the second amount of energy exceeds the first amount of energy. Related systems, apparatus, techniques, and articles are also described.

17 Claims, 12 Drawing Sheets

(51) Int. Cl.
  *A47J 36/32* (2006.01)
  *A47J 37/00* (2006.01)
  *A47J 37/07* (2006.01)
  *F24C 5/16* (2006.01)
  *G01R 19/165* (2006.01)
  *G01R 27/14* (2006.01)
  *H02P 29/40* (2016.01)
  *H05B 1/02* (2006.01)

(52) U.S. Cl.
  CPC ....... *G01R 19/16571* (2013.01); *G01R 27/14* (2013.01); *H02P 29/40* (2016.02); *H05B 1/0261* (2013.01); *A23V 2002/00* (2013.01); *A47J 37/00* (2013.01); *F24C 5/16* (2013.01)

(58) Field of Classification Search
  USPC ...................................................... 219/260
  See application file for complete search history.

(56) References Cited

U.S. PATENT DOCUMENTS

| | | | |
|---|---|---|---|
| 7,703,389 | B2 | 4/2010 | Mclemore et al. |
| 8,109,263 | B2 | 2/2012 | Pliml |
| 9,441,838 | B2 | 9/2016 | Baker |
| 9,883,770 | B2 | 2/2018 | Hunt et al. |
| 9,930,897 | B2 | 4/2018 | Blue et al. |
| 10,021,887 | B2 | 7/2018 | Mclemore et al. |
| 10,045,546 | B2 | 8/2018 | Giebel et al. |
| 10,292,531 | B1 | 5/2019 | Hancock et al. |
| 10,327,584 | B2 | 6/2019 | Shingler et al. |
| 10,327,588 | B2 | 6/2019 | Dahle et al. |
| 10,327,589 | B1 | 6/2019 | Dahle et al. |
| 10,455,979 | B2 | 10/2019 | Colston et al. |
| 10,478,016 | B2 | 11/2019 | Mclemore et al. |
| 10,588,461 | B2 | 3/2020 | Dahle |
| 10,660,473 | B2 | 5/2020 | Dahle et al. |
| 10,674,866 | B2 | 6/2020 | Colston |
| 10,694,892 | B2 | 6/2020 | Colston |
| 10,772,467 | B2 | 9/2020 | Dahle |
| 10,888,193 | B2 | 1/2021 | Dahle et al. |
| 10,952,564 | B2 | 3/2021 | Dahle et al. |
| 10,959,572 | B2 | 3/2021 | Dahle et al. |
| 10,986,960 | B2 | 4/2021 | Colston |
| 10,995,964 | B2 | 5/2021 | Dahle |
| 11,162,684 | B2 | 11/2021 | Colston et al. |
| 11,172,688 | B2 | 11/2021 | Powell et al. |
| 11,181,276 | B2 | 11/2021 | Colston et al. |
| 11,181,277 | B2 | 11/2021 | Donnelly et al. |
| 11,206,948 | B2 | 12/2021 | Measom et al. |
| 11,684,212 | B2 | 6/2023 | Dahle et al. |
| 11,732,895 | B1 | 8/2023 | Chow et al. |
| 2018/0139973 | A1 | 5/2018 | Flood et al. |
| 2018/0168397 | A1 | 6/2018 | Colston |
| 2019/0290064 | A1* | 9/2019 | Colston ................ A23B 4/0523 |
| 2019/0290069 | A1 | 9/2019 | Colston et al. |
| 2019/0320669 | A1 | 10/2019 | Powell et al. |
| 2020/0093145 | A1 | 3/2020 | Powell et al. |
| 2020/0116349 | A1 | 4/2020 | Rahmani et al. |
| 2020/0202027 | A1 | 6/2020 | Chan et al. |
| 2020/0214501 | A1 | 7/2020 | Gafford et al. |
| 2020/0214503 | A1 | 7/2020 | Altenritter |
| 2020/0237139 | A1 | 7/2020 | Colston |
| 2020/0275804 | A1 | 9/2020 | Dahle |
| 2021/0007550 | A1 | 1/2021 | Puertas et al. |
| 2021/0052108 | A1 | 2/2021 | Dahle |
| 2021/0169269 | A1 | 6/2021 | Meadows et al. |
| 2021/0196078 | A1 | 7/2021 | Colston et al. |
| 2021/0196079 | A1 | 7/2021 | Dahle et al. |
| 2021/0228020 | A1 | 7/2021 | Hanks et al. |
| 2021/0235927 | A1 | 8/2021 | Colston |
| 2021/0244233 | A1 | 8/2021 | Bush et al. |
| 2021/0251423 | A1 | 8/2021 | Dahle et al. |
| 2021/0282590 | A1 | 9/2021 | Dahle et al. |
| 2021/0302027 | A1 | 9/2021 | Dahle |
| 2021/0315416 | A1 | 10/2021 | Fullmer et al. |
| 2021/0352923 | A1 | 11/2021 | Li et al. |
| 2021/0369052 | A1 | 12/2021 | Fullmer et al. |

FOREIGN PATENT DOCUMENTS

| | | |
|---|---|---|
| AU | 2018251790 A1 | 10/2019 |
| AU | 2019202070 A1 | 10/2019 |
| AU | 2019202071 A1 | 10/2019 |
| AU | 2019202074 A1 | 10/2019 |
| AU | 2019202075 A1 | 10/2019 |
| AU | 2019342959 A1 | 4/2021 |
| CA | 2941277 A1 | 4/2017 |
| CA | 3037207 A1 | 3/2019 |
| CA | 3037934 A1 | 9/2019 |
| CA | 3037936 A1 | 9/2019 |
| CA | 3038088 A1 | 9/2019 |
| CA | 3066299 A1 | 7/2020 |
| CN | 203852233 U | 10/2014 |
| CN | 205391021 U | 7/2016 |
| CN | 107529920 A | 1/2018 |
| CN | 110353518 A | 10/2019 |
| CN | 110353519 A | 10/2019 |
| CN | 110353520 A | 10/2019 |
| CN | 110353525 A | 10/2019 |
| CN | 111493681 A | 8/2020 |
| CN | 106998964 B | 10/2021 |
| DE | 212016000022 U1 | 8/2017 |
| DE | 212016000157 U1 | 3/2018 |
| DE | 102019107552 A8 | 3/2020 |
| EP | 1517093 B1 | 7/2006 |
| EP | 1514502 B1 | 12/2006 |
| EP | 2605690 B1 | 11/2014 |
| EP | 2433530 B1 | 12/2014 |
| EP | 3364838 A4 | 5/2019 |
| EP | 3677157 A1 | 7/2020 |
| EP | 3375335 B1 | 8/2020 |
| EP | 3865031 A1 | 8/2021 |
| GB | 2555054 A | 4/2018 |
| GB | 2558532 A | 7/2018 |
| GB | 2572489 A | 10/2019 |
| GB | 2572491 A | 10/2019 |
| GB | 2572492 A | 10/2019 |
| JP | 2018526036 A | 9/2018 |
| KR | 20180039541 A | 4/2018 |
| KR | 20180067383 A | 6/2018 |
| WO | 2017044598 A1 | 3/2017 |
| WO | 2021138455 A4 | 9/2021 |

\* cited by examiner

METHODS AND SYSTEMS FOR OPEN-LOOP IGNITION OF A SMOKE GENERATOR FUEL SOURCE

CROSS-REFERENCE TO RELATED APPLICATIONS

The present application is a continuation of and claims priority to U.S. patent application Ser. No. 17/663,582, filed on May 16, 2022, entitled "METHODS AND SYSTEMS FOR OPEN-LOOP IGNITION OF A SMOKE GENERATOR FUEL SOURCE", the entire contents of which are incorporated herein by reference.

FIELD

The current subject matter relates to methods and systems for open-loop ignition of a smoke generator fuel source.

BACKGROUND

Smoke can be used in a variety of cooking devices and with a variety of cooking operations to impart flavor. As an example, grills and grilling devices can come equipped with smoking capabilities, or the means with which to impart smoke flavor into food cooked with these grills and grilling devices. However, electric cooking appliances may only be able to impart limited smoke flavor or no smoke flavor into food cooked therewith. Further, in grilling systems which impart smoke flavor into food, control of the smoke output can be challenging.

Additionally, the quality of the smoke output can depend on how the fuel source used to generate the smoke is ignited. For example, if the fuel source is over-ignited by an igniter, the ignitor can provide an excessive amount of energy to the fuel source, such that there is too much combustion for the amount of airflow within the system and not enough oxygen supply to sustain a clean and efficient burn. For example, if the fuel source is under-ignited by the igniter, the igniter can provide too little energy to the fuel source, such that there is not a large enough ember generated to ensure a self-sustained combustion reaction that will spread throughout the rest of the fuel source in a consistent manner. In order to generate optimal smoke production for cooking, there is an ideal range of energy that must be provided to the fuel source from the ignitor such that there is just the right amount of heat to create a sustained combustion reaction, but not so much that combustion region starves itself of oxygen or burns through a fuel source more vigorously than intended.

However, reliably monitoring the performance of the fuel source ignition process, such that it results in optimized smoke production for cooking, can be difficult due to the nature of the perceivable outputs from combustion. For example, the physical outputs resulting from combustion of the fuel source are heat and combustion products such as smoke compounds or $CO_2$— therefore, in order to achieve closed loop control for combustion, a given control system must be able to detect those outputs from combustion in a statistically significant way. However, designing a system that would be cost effective and reliable enough to detect either of these outputs can be impractical. Additionally, closed loop control from the perspective of detecting combustion products as an input can also be challenging because it can be infeasible or impossible to implement a sensor that is safe, cost effective, and able to withstand the operating environment of a smoke generator.

SUMMARY

Methods and systems for open-loop ignition of a smoke generator fuel source are provided. Related apparatus, techniques, and articles are also described.

In an aspect, data characterizing an instruction for an activation of an igniter and an operating mode of a smoke generator that includes the igniter can be received. A first amount of energy required for an ignition of a fuel source by the igniter can be determined based on the operating mode characterized by the received data. The igniter can be caused to activate based on the received data. A second amount of energy, output by the igniter over a period of time during which the igniter is activated, can be determined. A determination of whether the second amount of energy exceeds the first amount of energy can be made. The igniter can be caused to deactivate in response to a determination that the second amount of energy exceeds the first amount of energy.

One or more of the following features can be included in any feasible combination. For example, the igniter can be an electrical heating element. For example, current data characterizing an amount of electric current provided to the smoke generator during one or more portions of the period of time can be received, and the second amount of energy can be determined based on the received current data and a nominal electrical resistance of the igniter. For example, voltage data characterizing a voltage level of electricity provided to the smoke generator during the one or more portions of the period of time can be received, an actual electrical resistance of the igniter can be determined based on the received voltage data and the received current data, and the second amount of energy can be determined based on the actual electrical resistance of the igniter. For example, a first scaling parameter that characterizes a factor of compensation for a variation of the amount of electric current provided to the smoke generator during the one or more portions of the period of time can be determined, and the second amount of energy can be determined based on the first scaling parameter. For example, a second scaling parameter that characterizes a factor of compensation for a discrepancy between the amount of the electric current provided to the smoke generator and an amount of a first portion of the electric current that is provided to the igniter during the one or more portions of the period of time can be determined, and the first scaling parameter can be determined based on the second scaling parameter. For example, first phase angle data characterizing a first phase angle target for a motor configured to operate a fan coupled to the motor in communication with the smoke generator can be determined, and the first phase angle target can correspond to a first rotational speed of the fan. For example, an amount of a second portion of the electric current that is provided to the fan during the one or more portions of the period of time can be determined based on the received first phase angle data, and the second scaling parameter can be determined based on the determined amount of the second portion of the electric current. For example, generator temperature data characterizing a temperature of the smoke generator and ambient temperature data characterizing an ambient temperature of the air proximate the smoke generator can be received, and the first amount of energy can be determined based on the received generator temperature data and the received ambient temperature data. For example, second phase angle data characterizing a second phase angle target for the motor during the period of time can be determined based on the determined first amount of energy, the second phase angle target can correspond to a second rotational speed of the fan, and the second phase angle data can be provided to the motor to thereby cause the fan to operate at the second rotational speed during the period of time. For example, the second phase angle data can be determined based on a temperature of the motor. For example, the first phase angle target can be based on the operating mode of the smoke generator. For example, igniter current data characterizing an amount of electric current provided to the igniter during one or more portions of the period of time can be received, and the second amount of energy can be determined based on the received igniter current data and a nominal electrical resistance of the igniter.

In another aspect, a system is provided and can include at least one data processor and memory storing instructions configured to cause the at least one data processor to perform operations described herein. The operations can include receiving data characterizing an instruction for an activation of an igniter and an operating mode of a smoke generator that includes the igniter; determining, based on the operating mode characterized by the received data, a first amount of energy required for an ignition of a fuel source by the igniter; causing the igniter to activate based on the received data; determining a second amount of energy output by the igniter over a period of time during which the igniter is activated; determining whether the second amount of energy exceeds the first amount of energy; and causing the igniter to deactivate in response to determining that the second amount of energy exceeds the first amount of energy.

One or more of the following features can be included in any feasible combination. For example, the igniter can be an electrical heating element. For example, the operations can further include receiving current data characterizing an amount of electric current provided to the smoke generator during one or more portions of the period of time, and the second amount of energy can be determined based on the received current data and a nominal electrical resistance of the igniter. For example, the operations further include receiving voltage data characterizing a voltage level of electricity provided to the smoke generator during the one or more portions of the period of time; and determining, based on the received voltage data and the received current data, an actual electrical resistance of the igniter, and the second amount of energy can be determined based on the actual electrical resistance of the igniter. For example, the operations can further include determining, based on the received current data, a first scaling parameter that characterizes a factor of compensation for a variation of the amount of the electric current provided to the smoke generator during the one or more portions of the period of time, and the second amount of energy can be determined based on the first scaling parameter. For example, the operations can further include determining, based on the received current data, a second scaling parameter that characterizes a factor of compensation for a discrepancy between the amount of the electric current provided to the smoke generator and an amount of a first portion of the electric current that is provided to the igniter during the one or more portions of the period of time, and the first scaling parameter can be determined based on the second scaling parameter. For example, the operations can further include receiving first phase angle data characterizing a first phase angle target for a motor configured to operate a fan coupled to the motor in communication with the smoke generator, the first phase angle target corresponding to a first rotational speed of the fan; and determining, based on the received first phase angle data, an amount of a second portion of the electric current that is provided to the fan during the one or more portions of the period of time, and the second scaling parameter can be determined based on the determined amount of the second portion of the electric current. For example, the operations can further include receiving generator temperature data characterizing a temperature of the smoke generator and ambient temperature data characterizing an ambient temperature of the air proximate the smoke generator, and the first amount of energy can be determined based on the received generator temperature data and the received ambient temperature data. For example, the operations can further include determining, based on the determined first amount of energy, second phase angle data characterizing a second phase angle target for the motor during the period of time, the second phase angle target corresponding to a second rotational speed of the fan; and providing the second phase angle data to the motor to thereby cause the fan to operate at the second rotational speed during the period of time. For example, the second phase angle data can be determined based on a temperature of the motor. For example, the first phase angle target can be based on the operating mode of the smoke generator. For example, the operations can further include receiving igniter current data characterizing an amount of electric current provided to the igniter during one or more portions of the period of time, and the second amount of energy can be determined based on the received igniter current data and a nominal electrical resistance of the igniter.

Non-transitory computer program products (i.e., physically embodied computer program products) are also described that store instructions, which when executed by one or more data processors of one or more computing systems, causes at least one data processor to perform operations herein. Similarly, computer systems are also described that may include one or more data processors and memory coupled to the one or more data processors. The memory may temporarily or permanently store instructions that cause at least one processor to perform one or more of the operations described herein. In addition, methods can be implemented by one or more data processors either within a single computing system or distributed among two or more computing systems. Such computing systems can be connected and can exchange data and/or commands or other instructions or the like via one or more connections, including a connection over a network (e.g. the Internet, a wireless wide area network, a local area network, a wide area network, a wired network, or the like), via a direct connection between one or more of the multiple computing systems, etc.

The details of one or more variations of the subject matter described herein are set forth in the accompanying drawings and the description below. Other features and advantages of the subject matter described herein will be apparent from the description and drawings, and from the claims.

DESCRIPTION OF DRAWINGS

The embodiments described above will be more fully understood from the following detailed description taken in conjunction with the accompanying drawings. The drawings are not intended to be drawn to scale. For purposes of clarity, not every component may be labeled in every drawing. In the drawings.

Figure 1:
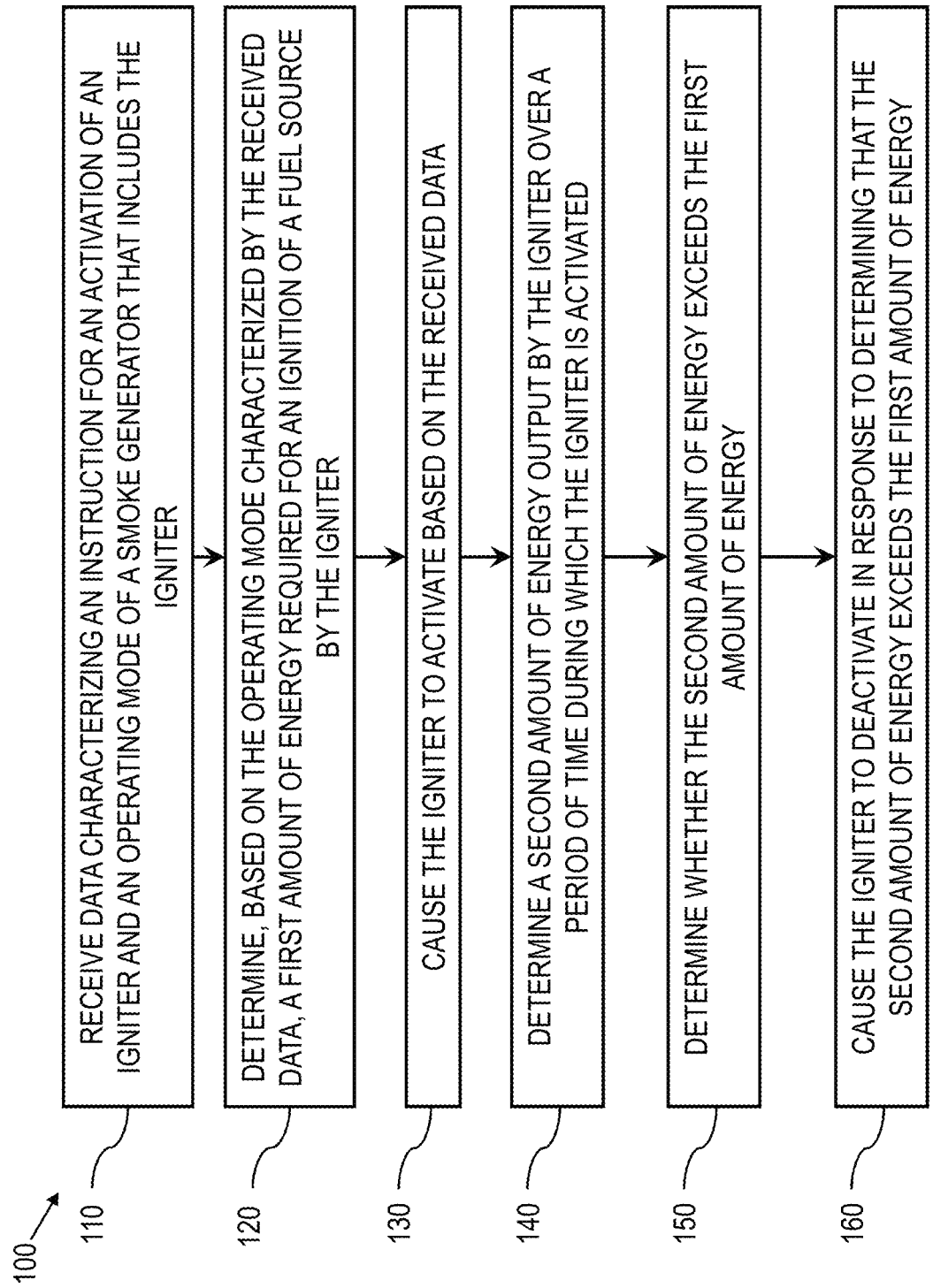
FIG. 1 is a process flow diagram illustrating an example process of some implementations of the current subject matter that can provide for open-loop ignition of a smoke generator fuel source.

It is noted that the drawings are not necessarily to scale. The drawings are intended to depict only typical aspects of the subject matter disclosed herein, and therefore should not be considered as limiting the scope of the disclosure.

DETAILED DESCRIPTION

Certain exemplary embodiments will now be described to provide an overall understanding of the principles of the structure, function, manufacture, and use of the devices and methods disclosed herein. One or more examples of these embodiments are illustrated in the accompanying drawings. Those skilled in the art will understand that the devices and methods specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

Further, in the present disclosure, like-named components of the embodiments generally have similar features, and thus within a particular embodiment each feature of each like-named component is not necessarily fully elaborated upon. Additionally, to the extent that linear or circular dimensions are used in the description of the disclosed systems, devices, and methods, such dimensions are not intended to limit the types of shapes that can be used in conjunction with such systems, devices, and methods. A person skilled in the art will recognize that an equivalent to such linear and circular dimensions can easily be determined for any geometric shape.

Smoke can be used in a variety of cooking devices and with a variety of cooking operations to impart flavor. As an example, grills and grilling devices can come equipped with smoking capabilities, or the means with which to impart smoke flavor into food cooked with these grills and grilling devices. However, in grilling systems and/or electric cooking devices which impart smoke flavor into food, control of the smoke output can be challenging, and the quality of the smoke supplied to the food can depend on the quality of the ignition of the fuel source used to generate the smoke, in addition to the airflow through the combustion region. For example, if the fuel source is over-ignited by an igniter, the ignitor can provide an excessive amount of energy to the fuel source, such that there is too much combustion for the amount of airflow within the system and not enough oxygen supply to sustain a clean efficient burn. The result is combustion that imparts an ashy bitter flavor to the food or damages other parts of the system due to a large flame following the airflow path downstream toward the food from the burn region. In addition, over-ignition could also cause the fuel source to burn too hot and too fast, causing low smoke durations, exceedingly high temperatures, and a "smokeless" burn that imparts little flavor on the food. For example, if the fuel source is under-ignited by the igniter, the igniter can provide too little energy to the fuel source, such that there is not a large enough ember generated to ensure a self-sustained combustion reaction that will spread throughout the rest of the fuel source in a consistent manner. This could cause low smoke production, low smoke flavor, unburnt fuel, short smoke durations, or even no combustion of the fuel source at all. In order to generate optimal smoke production for cooking, there is an ideal range of energy that must be provided to the fuel source from the ignitor such that there is just the right amount of heat to create a sustained combustion reaction, but not so much that combustion region starves itself of oxygen or burns through a fuel source more vigorously than intended. As such, ensuring optimal ignition of the fuel source for smoking operations is important to maintaining the quality of the smoke generated, and, as a result, the quality of the smoke flavor imparted into the food being prepared.

However, reliably monitoring the performance of the fuel source ignition process, such that it results in optimized smoke production for cooking, can be difficult due to the nature of the perceivable outputs from combustion. For example, the physical outputs resulting from combustion of the fuel source are heat and combustion products such as smoke compounds or $CO_2$— therefore, in order to achieve closed loop control for combustion, a given control system must be able to detect those outputs from combustion in a statistically significant way. However, designing a system that would be cost effective and reliable enough to detect either of these outputs can be impractical. A challenge in detecting the heat generated by combustion of the fuel source during ignition can arise from the fact that the amount of heat energy required to ignite the fuel source can be significantly larger than the amount of heat generated by the combustion of the fuel source itself, such that a simple temperature sensor would not be able to discern whether a temperature rise is due to heat energy contributed by the fuel source or the ignitor in the system. Furthermore, it can also be extremely difficult to decouple a given temperature sensor from the heat of the ignitor while keeping it coupled to energy generated by combustion of the fuel source. As a result, closed loop control of combustion with heat detection can be infeasible.

Additionally, closed loop control from the perspective of detecting combustion products as an input can also be challenging because it can be infeasible or impossible to implement a sensor that is safe, cost effective, and able to withstand the operating environment of a smoke generator. Indeed, any implemented sensor would not only have to withstand high operating temperatures, but its performance must also be unaffected by the buildup of creosote, cooking oils, and steam that can coat one or more surfaces of the sensor. For example, optical sensing of smoke can quickly fail after a low number of smoke cycles due to creosote/combustion compounds condensing on any implemented optical sensor. In addition, chemiresistive sensors can be unable to maintain the same sensitivity throughout multiple cycles due to contamination of the sensing element due to high concentrations of smoke compounds at possible sites of measurements. Ultimately, any sensor that would be able to survive under the operating conditions of a smoke generator can be too complex to implement in a cost-effective manner for a consumer product.

In general, methods and systems for open-loop ignition of a smoke generator fuel source are provided. The open-loop ignition process can determine an amount of energy required for the fuel source to be ignited and an amount of energy output by an igniter proximate to the fuel source over a period of time during which the igniter is operating. The open-loop ignition process can then determine whether the amount of energy output by the igniter exceeds the amount of energy required for the fuel source to be ignited and then cause the igniter to deactivate when that condition is met. As a result, some implementations of the open-loop ignition process described herein can provide for consistently optimized ignition of the fuel source, thereby resulting in optimized smoke output and consistent quality of smoke imparted into food during its preparation in a grill or other cooking system/device, and without requiring real-time, closed-loop feedback from the smoke generator during the ignition of the fuel source to provide an optimized smoke output. Some implementations of the open-loop ignition process described herein can provide a highly effective method of ensuring optimized ignition because it can circumvent the difficulties in sensing the presence and/or intensity of combustion by extracting key quantities from the physical ignition system to generate a model for the physical system that is accurate enough to provide consistent and optimal ignition. For example, variables such as ambient air temperature, weather, initial temperature of the ignition region, airflow through the ignition region, and igniter power can all be accounted for with relative precision by some implementations of the open-loop ignition process described herein. With one or more of these variables accounted for, the open-loop ignition process can essentially determine the energy input required to create the desired ignition output without requiring expensive and/or complicated sensor or design considerations required for closed loop control while ensuring optimized run-to-run ignition/smoke performance. As such, some implementations of the current subject matter can provide for consistent, reliable ignition performance without closed loop monitoring and control.

FIG. 1 is a process flow diagram illustrating an example process 100 of some implementations of the current subject matter that can provide for open-loop ignition of a smoke generator fuel source.

At 110, data characterizing an instruction for an activation of an igniter and an operating mode of a smoke generator that includes the igniter can be received. In some implementations, the instruction for activation can be received at a user interface of a controller operably connected to the smoke generator, and from a user via the user's operation of the user interface. In some embodiments, the igniter can include an electrical resistive heating element and electrical contacts on opposing ends of the heating element that are configured to receive a flow of electrical current from a power source and to generate heat as a result of the received current flow and due to the electrical resistance of the heating element. In some implementations, as explained in further detail herein, the igniter can, as a result of the received current flow and the resultant heat generated by the igniter, be configured to ignite a fuel source disposed proximate the igniter once the data characterizing the instruction to activate the igniter has been received.

In some embodiments, the smoke generator can be an assembly of components that permits the generation and/or transport of smoke into a cooking chamber of a cooking system as described elsewhere herein. For example, in some embodiments, the igniter can be incorporated into the smoke generator, such as a smoke assembly as described elsewhere herein, and the smoke generator can be configured to be integrated into a cooking system. In some implementations, the smoke generator can also include a compartment for receiving and retaining a fuel source (e.g., wood pellets, wood chips, etc.) in a location that is proximate the igniter as described in further detail elsewhere herein. In addition, in some embodiments, one or more components of the smoke generator can be physically separate from the cooking system, such that the smoke generator is in fluid communication with the chamber of the cooking system and is thereby able to provide smoke for imparting into the food within the chamber.

In some embodiments, the operating mode can be a mode of operating the smoke generator and/or the cooking system that permits smoke to be imparted into the food in such a way as to achieve a desired smoke flavor of the food and can be selected via the user's operation of the user interface described above. For example, in some implementations, the operating mode can be a smoke infusion mode in which the smoke generator outputs a limited-duration burst of smoke on an on-demand basis (e.g., a relatively short portion of the time during which the food is cooked with the cooking system). In some embodiments, the operating mode can be a smoke mode in which the smoke generator outputs smoke for an extended duration of time (e.g., a relatively long portion of, or all of, the time during which the food is cooked using the cooking system).

At 120, a first amount of energy required for an ignition of the fuel source by the igniter can be determined based on the operating mode characterized by the received data. The first amount of energy can be an amount of energy that, once output by the igniter and provided to the fuel source, can cause the fuel source to combust and to begin to generate smoke, and this amount can vary based on which of the operating modes is selected and characterized by the received data as described above. For example, in some implementations, the determined first amount of energy can be a relatively lower amount of energy when the operating mode is set to a smoke mode, and the determined first amount of energy can be a relatively higher amount of energy when the operating mode is set to a smoke infusion mode, as compared to when the operating mode is set to a smoke mode.

In some implementations, the amount of energy that is required to cause the fuel source to combust can depend on a temperature of the smoke generator, a temperature of the cooking system, and/or an ambient temperature of the air that is proximate the smoke generator. As such, in some embodiments, temperature data that characterizes the temperature of the smoke generator, the temperature of the cooking system, and/or the ambient temperature of the air that surrounds the smoke generator can be received and used in the determination of the amount of energy required for combustion. For example, in some implementations, the temperature data characterizing a temperature of the smoke generator can be received from a sensor (e.g., thermocouple, thermometer, etc.) that is in fluid communication with the compartment of the smoke generator that houses the fuel source and that is configured to determine the temperature of the smoke generator by observing the temperature of the air inside the compartment. Similarly, in some implementations, the temperature data characterizing a temperature of the cooking system can be received from a sensor (e.g., thermocouple, thermometer, etc.) that is in fluid communication with the cooking chamber of the cooking system and that is configured to determine the temperature of the cooking system by observing the temperature of the air inside the cooking chamber. In some implementations, the temperature data characterizing an ambient temperature of the air that is proximate the smoke generator can be received from a sensor (e.g., thermocouple, thermometer, etc.) that is in fluid communication with the air surrounding the smoke generator and that is configured to determine the temperature of the air by observing the temperature of the air proximate the cooking chamber. In some implementations, the determined first amount of energy can vary inversely with the observed temperature of the smoke generator and/or the cooking system. For example, the determined first amount of energy, and thus the amount of energy required to cause the fuel source to combust and thereby begin to generate smoke, can be a relatively high amount of energy at relatively low smoke generator and/or cooking system temperatures, and the determined first amount of energy can be a relatively low amount of energy at relatively high smoke generator and/or cooking system temperature(s). Thus, the determined first amount of energy—and thus the amount of energy required to be output by the igniter to cause the fuel source to combust and thereby generate smoke, can decrease with increasing smoke generator and/or cooking system temperature(s).

At 130, the igniter can be activated based on the received data. For example, in some implementations, to activate the igniter, a command to cause the flow of electrical current to the igniter can be determined, and the command can be provided to a controller in operable communication with a power source and with both electrical contacts of the igniter. In response to the receipt of the command, the controller can cause the supply of electrical current from the power source and to one of the contacts of the igniter, such that the electrical current flows through the heating element to the other of the contacts and is returned to the power source. As a result of the electrical current flow and of the electrical resistance of the heating element, heat is emitted from the heating element and received by the fuel source in proximity to the igniter.

At 140, a second amount of energy, output by the igniter over a period of time during which the igniter is activated, can be determined. In some implementations, the period of time can encompass the entire period of time during which the igniter is activated (i.e., the entirety of the ignition cycle). In some implementations, the period of time can be a portion of the entire time during which the igniter is activated, and the second amount of energy can be repeatedly and incrementally determined for each period of time, of the entire time of igniter activation, such that a cumulative amount of energy output by the igniter while activated can be determined.

In some implementations, the determined second amount of energy can depend on the amount of electrical current that is provided to the smoke generator. For example, in some implementations, current data characterizing an amount of electric current provided to the smoke generator during one or more portions of the period of time can be received, and the determination of the second amount of energy can be based on the received current data. For example, in some implementations, the determined second amount of energy can increase with an increase in the current characterized by the current data. In some implementations, the determined second amount of energy can also depend on a nominal electrical resistance of the igniter (e.g., a typical electrical resistance of an igniter having the properties/characteristics of the igniter). For example, in some implementations, the determined second amount of energy can increase with a decrease in the nominal electrical resistance of the igniter. In some implementations, igniter current data characterizing an amount of electric current provided directly to the igniter during one or more portions of the period of time can be received, and the second amount of energy can be determined based on the received igniter current data and the nominal electrical resistance of the igniter. For example, in some implementations, the determined second amount of energy can increase with an increase in the amount of electric current provided directly to the igniter during the one or more portions of the period of time.

In some implementations, the determined second amount of energy can depend on actual electrical resistance of the igniter. For example, in some implementations, voltage data characterizing a level of voltage of electricity provided to the smoke generator during the one or more portions of the period of time can be received, and an actual electrical resistance of the igniter can be determined based on the received current data and the received voltage data. The determined actual electrical resistance of the igniter can in turn be used in the determination of the second amount of energy.

In some implementations, the amount of electrical current supplied to the smoke generator and/or the igniter can vary during an ignition cycle. As a result of this current variation, the cumulative amount of energy output by the igniter during an ignition cycle can also vary during the ignition cycle. To account for this variation, in some implementations, a compensation factor can be applied in determining the second amount of energy. For example, in some implementations, a numerical first scaling parameter that characterizes a factor of compensation for the variation in current supplied to the smoke generator over the one or more portions of the period of time can be determined, and the second amount of energy can be determined based on the first scaling parameter. For example, in some implementations, the determined second amount of energy can increase with an increase in the first scaling parameter. In some implementations, the first scaling parameter can be determined based on the amount of current supplied to the smoke generator. In some implementations, the first scaling parameter can be determined based on a nominal amount of current supplied to the smoke generator (e.g., a typical amount of current supplied to the smoke generator when using an igniter having the nominal electrical resistance described above and a nominal level of voltage, such as 120 Volts, that is applied to the smoke generator). For example, in some implementations, the determined first scaling parameter can increase with an increase in the nominal amount of current supplied to the smoke generator.

In some implementations, the first scaling parameter can be determined based on a second scaling parameter. In some implementations, the second scaling parameter can be a numerical scaling parameter that accounts for a discrepancy between the amount of electric current that is provided to the smoke generator and an amount of a first portion of the electric current that is provided to the igniter during the one or more portions of the period of time. For example, in some implementations, the amount of the first portion of the electric current that is provided to the igniter can be lower than the amount of electric current that is provided to the smoke generator, and the second scaling parameter can account for this reduction. For example, in some implementations, the determined first scaling parameter can increase with a decrease in the second scaling parameter.

In some implementations, the second scaling parameter can be determined based on the amount of electric current supplied to the smoke generator. In some implementations, the second scaling parameter can be determined based on the amount of electric current supplied directly to the igniter. In some implementations, the second scaling parameter can be determined based on an amount of a second portion of the electric current supplied to the smoke generator. The second portion of the electric current can be supplied to a motor coupled to a fan in fluid communication with the smoke generator, which can thereby operate the fan for drawing air to/away from the fuel source. For example, in some implementations, the second scaling parameter can decrease with an increase in the amount of the second portion of the electric current that is supplied to the motor.

The use of the fan during the ignition cycle can improve the performance of the ignition of the fuel source by the igniter, and, as explained in further detail below, the use of the fan can enhance the quality of the smoke delivered to the food in the cooking chamber of the cooking system. In some implementations, the amount of the second portion of the electric current can depend on a predetermined first phase angle target for the motor, and the phase angle target can correspond to a first rotational speed of the fan. As such, in some implementations, first phase angle data characterizing the predetermined first phase angle target can be received, the amount of the second portion of the electric current can be determined based on the received first phase angle data, and the second scaling parameter can be determined based on the determined amount of the second portion of the electric current. In some implementations, the first phase angle target can be based on the operating mode of the smoke generator.

In some implementations, during the period of time of the ignition cycle, the rotational speed of the fan can be adjusted to optimize the ignition of the fuel source by the igniter. For example, in some implementations, second phase angle data characterizing a second phase angle target for the motor during the period of time of ignition can be determined, and the second phase angle target can correspond to a second rotational speed of the fan. The second phase angle data can be provided to the motor to thereby cause the fan to operate at the second rotational speed during the period of time. In some implementations, the second phase angle data can be determined based on the determined first amount of energy that is required for ignition of the fuel source. In some implementations, the second phase angle data can be determined based on a temperature of the motor, which can be estimated based on information about the recent history of the overall system. For example, given that the motor is likely to operate the fan at a reduced rotational speed when operating at relatively cold temperatures, the second phase angle data can be adjusted to compensate for the rotational speed reduction resulting from the cold operation of the motor. In some implementations, an increase in the first phase angle target and/or the second phase angle target can result in an increase in the determined amount of the second portion of the electric current.

At 150, a determination of whether the second amount of energy exceeds the first amount of energy can be made. For example, in some implementations, the determined first amount of energy can be compared to the determined second amount of energy. If, in making the comparison, it is determined that the second amount of energy does not exceed the first amount of energy, then the igniter can remain in an activated state and continue to supply heat to the fuel source for an additional period of time, and the determination of the second amount of energy described above can be repeated such that the second amount of energy reflects the cumulative amount of energy supplied to the fuel source for the period of time and for the additional period of time. Additionally, in some implementations, if, in making the comparison, it is determined that the second amount of energy exceeds the first amount of energy, then the igniter can be deactivated as described in further detail below.

At 160, the igniter can be deactivated in response to a determination that the second amount of energy exceeds the first amount of energy. For example, in some implementations, to deactivate the igniter, a command to cease the flow of electrical current to the igniter can be determined, and the command can be provided to the controller (described above) that is in operable communication with the power source and with both electrical contacts of the igniter. In response to the receipt of the command, the controller can terminate the supply of electrical current from the power source and to one of the contacts of the igniter, such that the electrical current stops flowing through the heating element and heat is no longer emitted from the heating element and received by the fuel source.

Figure 2:
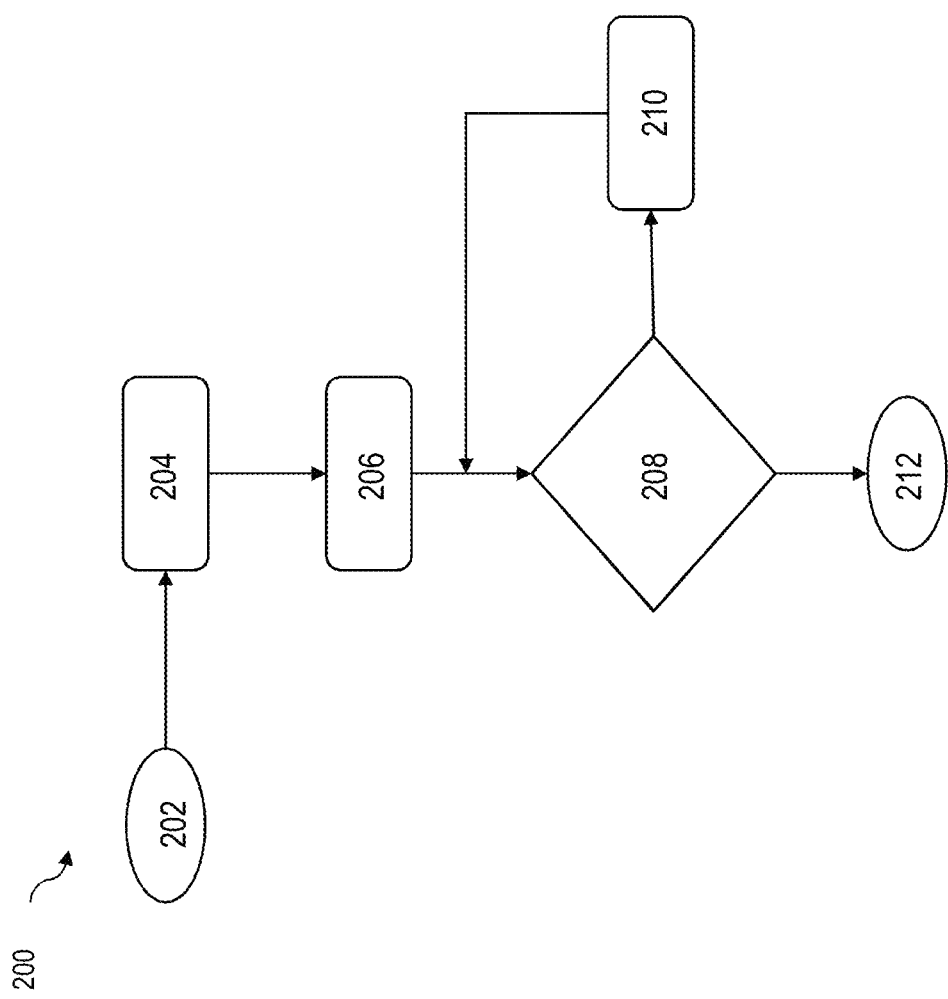
FIG. 2 is a process flow diagram illustrating an exemplary smoke generator ignition control process that can be used in some implementations of the current subject matter.

FIG. 2 is a process flow diagram 200 that illustrates an exemplary smoke generator ignition control process that can be used in some implementations of the current subject matter. As shown, the ignition control process can begin at 202, at which point data characterizing instructions to activate an igniter and an operating mode of the smoke generator, generator temperature data characterizing a temperature of the smoke generator, and ambient temperature data characterizing an ambient temperature of the air proximate the smoke generator, are received. Once the data sets described above are received, at 204, a first amount of energy required for an ignition of a fuel source by the igniter can be determined based on the temperature of the smoke generator, the ambient temperature of the air, and/or the operating mode characterized by the data received at 202. Once the first amount of energy has been determined, the igniter can be activated and a second amount of energy output by the igniter over a period of time can be determined at 206 in accordance with the methods described above. Once the second amount of energy has been determined, it can be compared to the first amount of energy at 208.

If, at 208, it is determined that the second amount of energy does not exceed the first amount of energy, the igniter remains activated for an additional period of time and the process can proceed to 210, at which point the second amount of energy is re-determined for a period of time spanning the original period of time and the additional period of time. The process then returns to 208, at which point the re-determined second amount of energy is compared to the originally-determined first amount of energy. If, at 208, it is determined that the re-determined second amount of energy does not exceed the originally determined first amount of energy, the igniter remains activated for a second additional period of time and the process returns to 210, at which point the second amount of energy is re-determined for a period of time spanning the original period of time, the additional period of time, and the second additional period of time. The process once again returns to 208 for the comparison described above. The comparison at 208, and the re-determination, at 210, of the cumulative second amount of energy output by the igniter over the aggregated periods of time during which the igniter is activated, iteratively occurs until it is determined, at 208, that the cumulative second amount of energy exceeds the originally-determined first amount of energy. Once the cumulative second amount of energy exceeds the first amount of energy, the igniter is deactivated at 212 as the igniter, at this point, has supplied an amount of energy sufficient to ignite the fuel source positioned proximate the igniter.

Figure 3A:
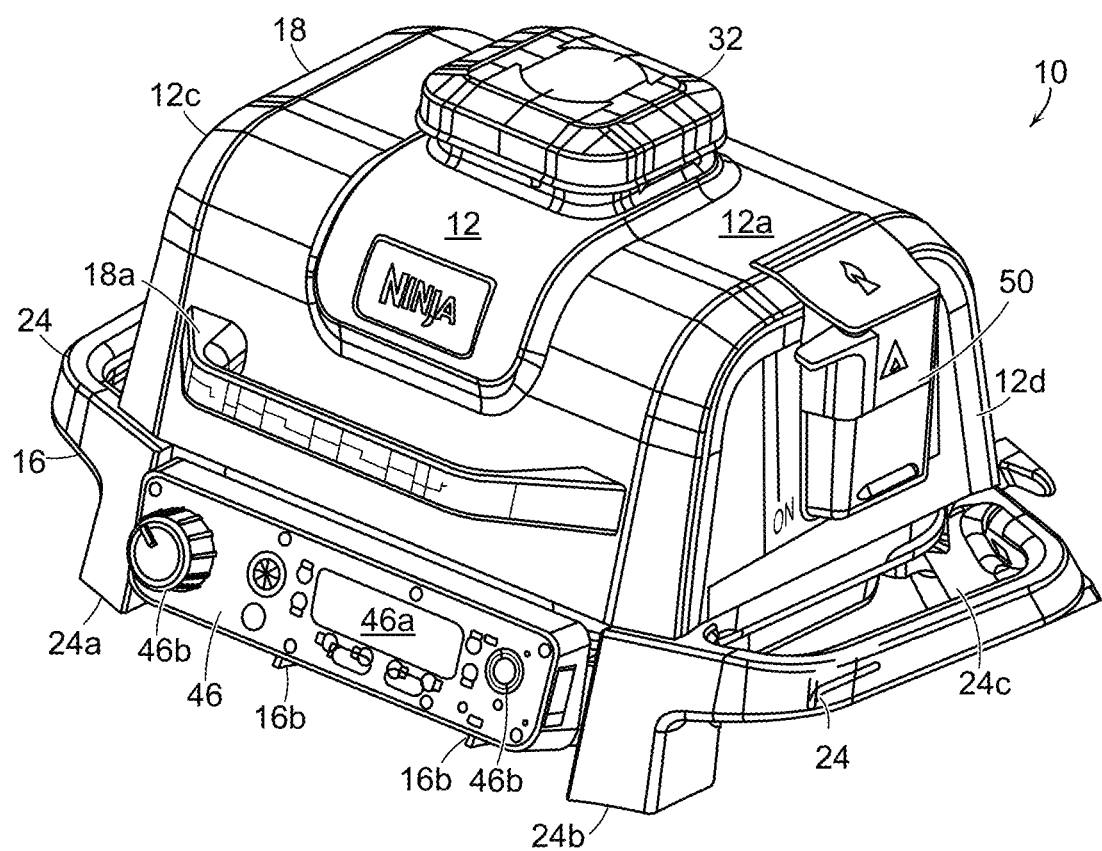
FIG. 3A is a front perspective view of one embodiment of an exemplary cooking system having an exemplary smoke generator mounted on an exterior thereof.

FIGS. 3A-3H illustrate an exemplary embodiment of a cooking system 10 that can be used in some implementations of the current subject matter. The illustrated cooking system 10 includes a housing 12 having a generally rectangular configuration with top and bottom surfaces 12a, 12b, and four sides, including left, right, front, and back sides 12c, 12d, 12e, 12f. The particular shape of the housing 12 can vary and certain surfaces can be rounded or have other variations that alter the appearance of the housing 12. For example, as shown in FIG. 3A, the sides 12c, 12d, 12e, 12f of the housing 12 diverge from the top surface 12a to the bottom surface 12b. Such a configuration can aid in providing stability, since the bottom portion of the housing 12 is larger than the top portion of the housing 12.

Figure 3B:
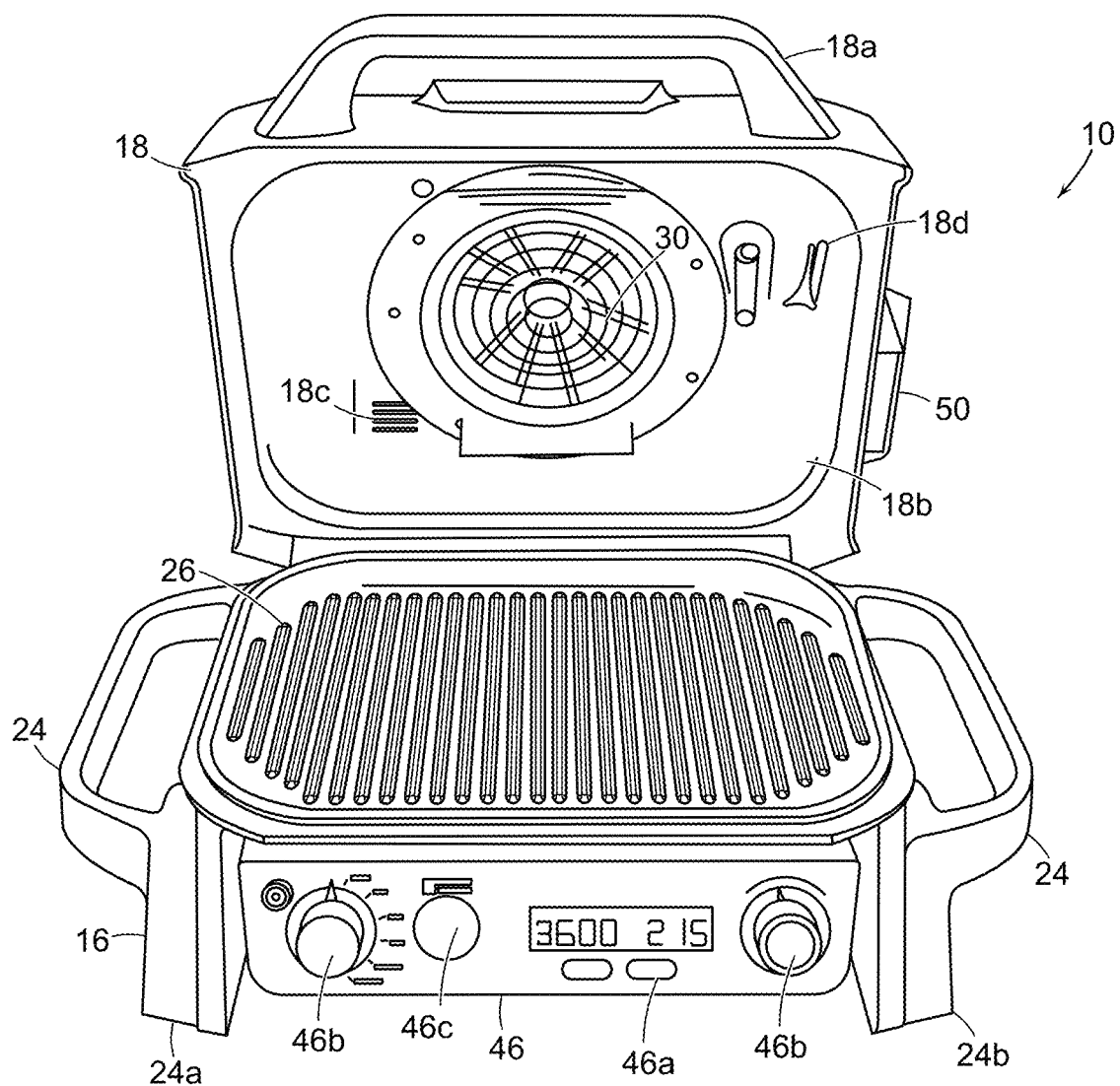
FIG. 3B is a front view of the cooking system of FIG. 3A, having a lid in an open position.
Figure 3C:
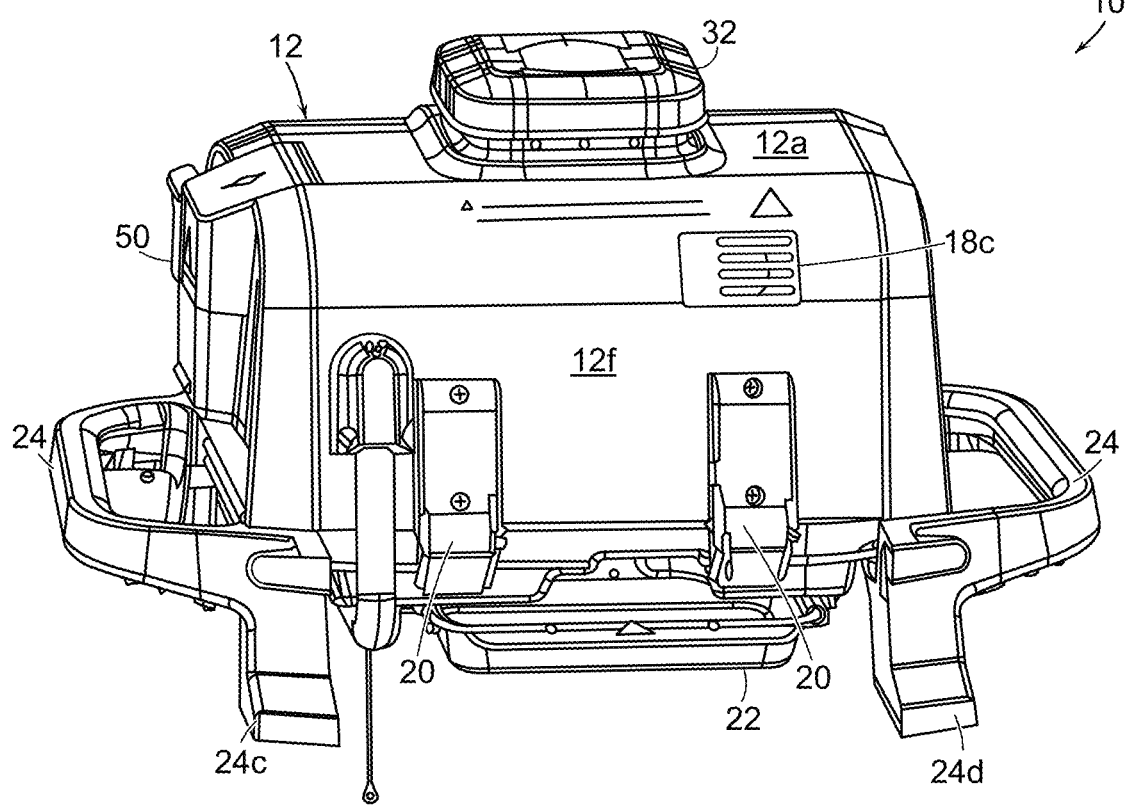
FIG. 3C is a rear perspective view of the cooking system of FIG. 3A.
Figure 3D:
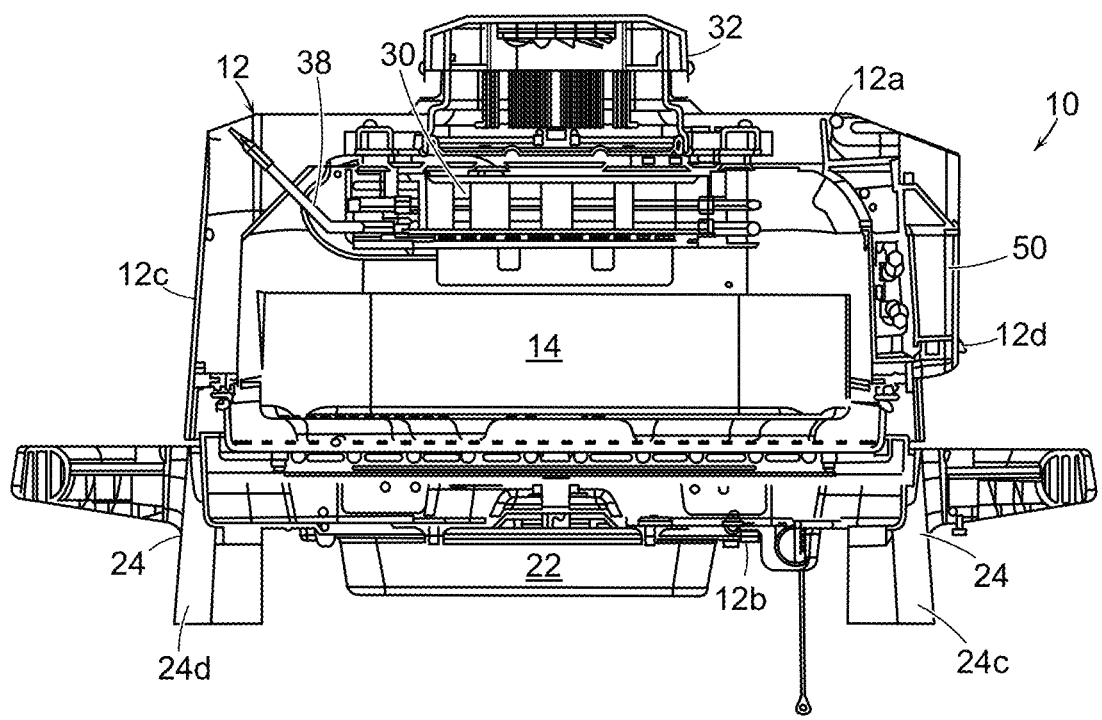
FIG. 3D is cross-sectional view of the cooking system of FIG. 3A.
Figure 3E:
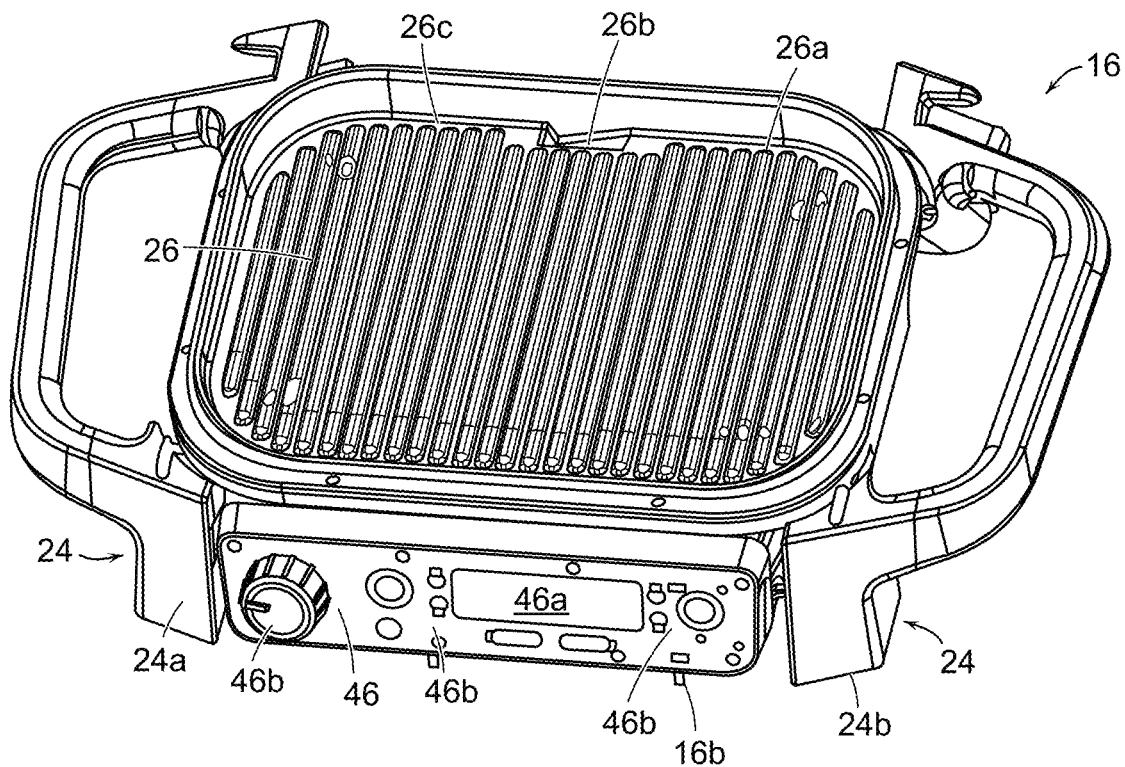
FIG. 3E is a front perspective view of the cooking system of FIG. 3A, having a lid in an open position.

The housing 12 further includes an interior hollow cooking chamber 14 defined within the housing 12, as shown in FIGS. 3B and 3D. The interior hollow cooking chamber 14 can be defined by a lower base portion 16 of the housing 12 and an upper lid portion 18 of the housing 12. The lower base portion 16 can define a substantial portion of the hollow cooking chamber 14, with the upper lid portion 18 being movably coupled to the lower base portion 16 for selectively enclosing the hollow cooking chamber 14.

In the illustrated embodiment, the upper lid portion 18 is coupled to the lower base portion 16 via a rear hinge 20, such that the upper lid portion 18 is configured to move between a closed position wherein the hollow cooking chamber 14 is closed off from an external environment, such as depicted in FIGS. 3A and 3C, and an open position wherein the hollow cooking chamber 14 is open to an external environment, such as depicted in FIG. 3B. The upper lid portion 18 can include a handle 18a mounted on an exterior surface to facilitate opening and closing the upper lid portion 18. In the closed position, as a result of containing the hollow cooking chamber 14, the upper lid portion 18 can contact the lower base portion 16 at a perimeter region thereof where the sides of the lower base portion 16 and the upper lid portion 18 meet. One or both of the perimeter regions can include a gasket or perimeter seal, such as perimeter seal 18b shown on the upper lid portion 18 in FIG. 3B, that is configured to prevent airflow through the perimeter region. The perimeter seal 18b can be made from a heat-resistant material that can withstand temperatures reached by the cooking assembly 10 during cooking operations. Likewise, the housing 12 can be formed from a heat-resistant material such that the housing 12 can support high cooking temperatures.

As further shown in FIGS. 3A-3H, the housing 12 can include additional elements. For example, a support structure 24 having four feet 24a, 24b, 24c, 24d disposed at corners thereof can be formed on or coupled to the bottom surface 12b to aid in stabilization of the cooking system 10. As further shown in FIGS. 3B and 3E-3F, a grill surface 26 can be formed on or disposed in the lower base portion 16 beneath an upper extent of the sidewalls and perimeter region thereof. In an exemplary embodiment, the grill surface 26 can include ridged portions 26a thereon, however in other embodiments, the grill surface 26 can be planer without any ridges. The grill surface 26 can be made from food safe materials used in combination with high heat, such as cast iron, steel, enamel-coated metal, ceramic-coated aluminum, or other materials known in the art. A lower heating element 28, shown in FIG. 3D, can be disposed beneath the grill surface 26 and it can configured to heat the grill surface 26 in order to facilitate conductive cooking operations therewith.

Figure 3F:
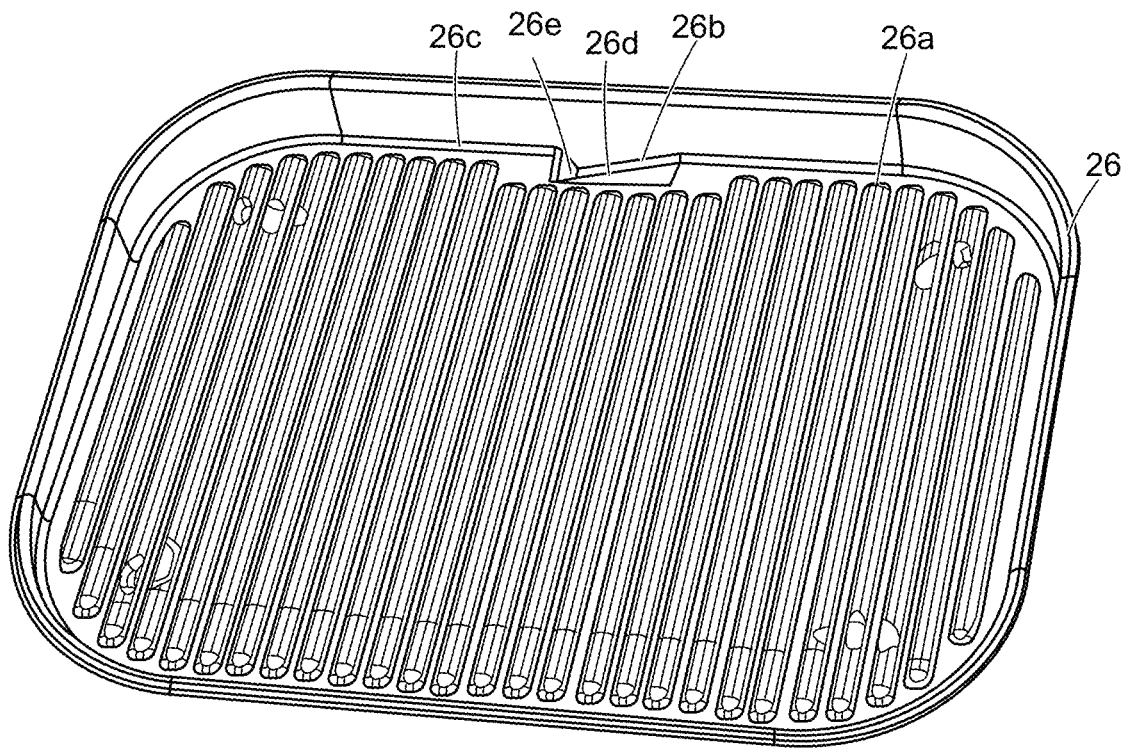
FIG. 3F is a front perspective view of a grill surface of the cooking system of FIG. 3A.
Figure 3G:
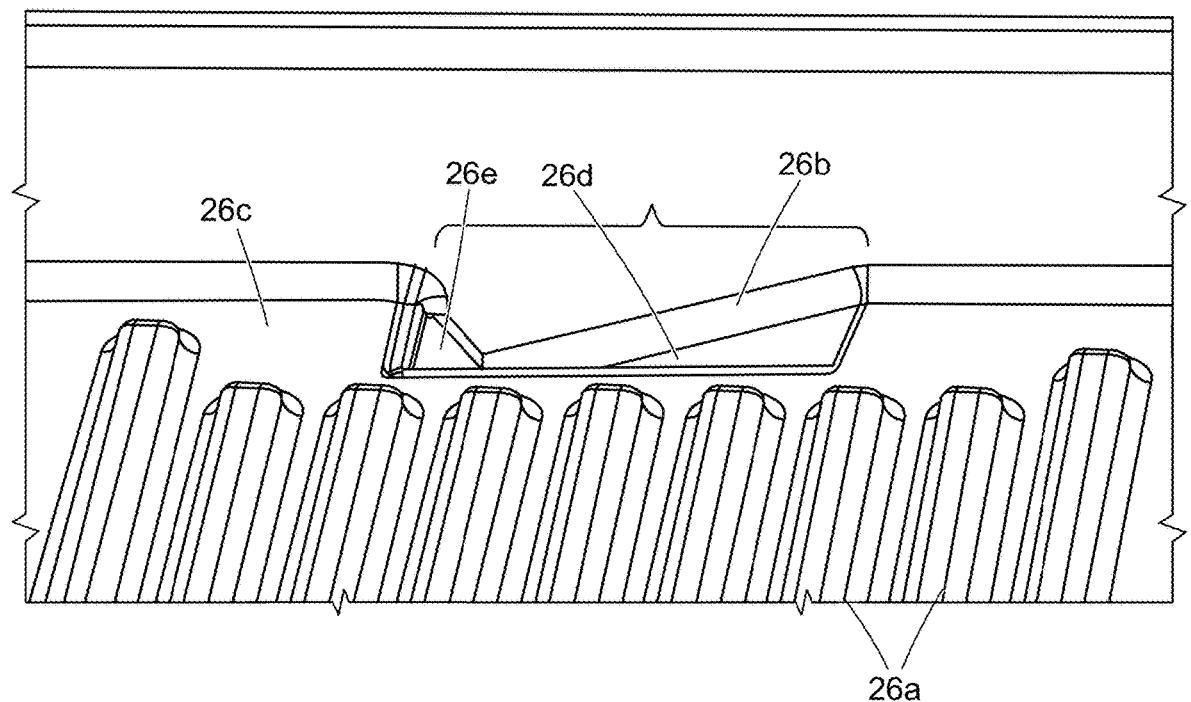
FIG. 3G is a front view of a grease drain of the cooking system of FIG. 3A.

As further shown in FIGS. 3F-3G, the grill surface 26 can include a grease drain 26b positioned to allow for drainage of excess grease, fat, and other liquids and waste created during various cooking operations. The grease drain 26b can be positioned at various locations, but in the illustrated embodiment it is formed in a bottom surface of the grill surface 26 and is positioned at a mid-portion of a rear wall thereof, as shown. A channel 26c formed around an exterior of the grill surface 26 can aid in directing grease toward the grease drain 26a, and may be angled downward to provide a gravity-assisted flow toward the grease drain 26a. The grease drain 26b can be sized to minimize excess airflow therethrough, and in this way can facilitate substantial sealing of the hollow cooking chamber 14 when the upper lid portion 18 is in the closed position. In the illustrated embodiment, as best shown in FIG. 3G, the grease drain 26b includes a ramped surface 26d extending downward from the grill surface 26 to an opening 26e formed at the end thereof. During a cooking process, as excess grease exits through the grease drain 26b, it can be collected in a container or reservoir 22, shown in FIG. 3C, to aid in disposal and cleaning. The reservoir 22 can in the form of a pan or tray, or in other forms, and can be removably attached to the lower base portion 16 in order to further aid in disposal.

Figure 3H:
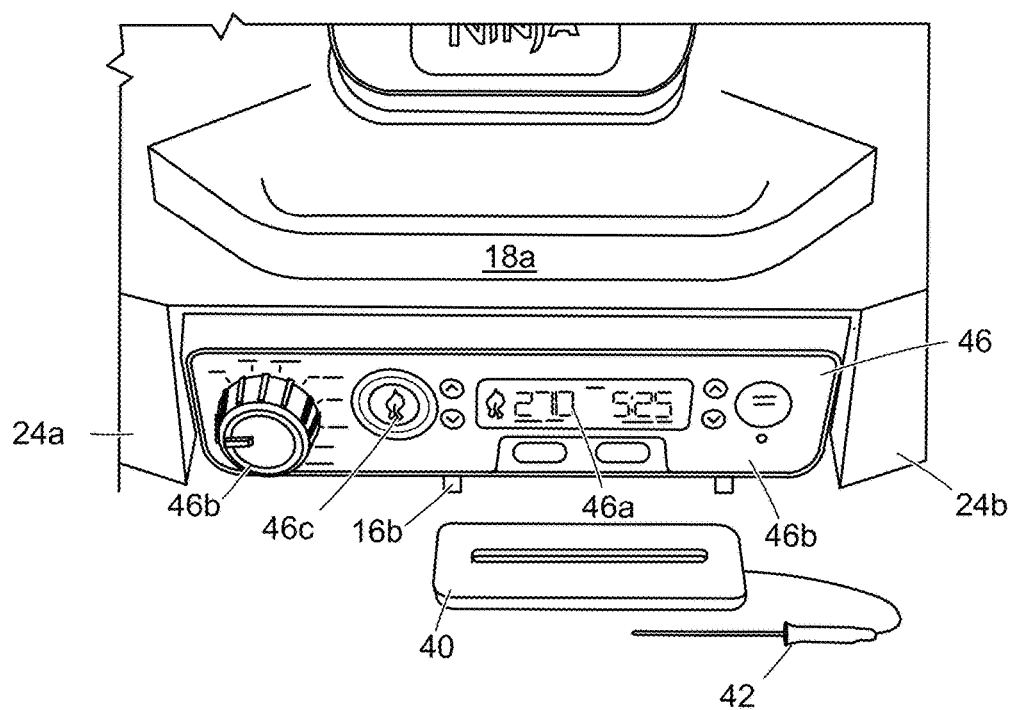
FIG. 3H is a front view of a user interface of the cooking system of FIG. 3A.

As shown in FIG. 3H, the lower base portion 16 can also include a probe holder 40 and probe 42 that can be removably mounted onto the housing. For example, the probe holder 40 with the probe 42 mounted therein can be sized to be received within a probe slot 16b, which is depicted in the form of a pair of arms that can retain the probe holder 40 therein. The probe 42 can be a temperature probe capable of interfacing with the cooking assembly 10 via a data port (not shown). While interfacing with the data port, the probe can be inserted into a food product to monitor a temperature thereof during a cooking process.

As further shown in FIGS. 3A-3D, the upper lid portion 18 can also include various features and elements. For example, as shown in FIGS. 1B and 1D, a fan 30 can be disposed on an upper interior surface of the upper lid portion 18, near a central region and within the hollow cooking chamber 14. The fan 30 can be configured to circulate air throughout the hollow cooking chamber 14 when in use. The fan 30 can circulate air in a variety of patterns, such as, for example, in a toroidal pattern, wherein air flows upward in the center region of the hollow cooking chamber 14 and then once it reaches the bottom of the cooking chamber 14, it can flow outward and downward in a second, opposite direction at the periphery of the hollow cooking chamber 14. The fan 30 can be electrically coupled to a motor (not shown) contained within a motor housing 32, and the motor housing 32 can centrally disposed on top of the upper lid portion 18. The motor housing 32 can include an additional fan 34 for cooling the motor, as well as vents 36 for providing air flow to the motor housing 32. Additional seal members (not shown) can be placed in the upper portion of the lid around electrical and mechanical fan components passing therethrough in order to contribute to further sealing of the hollow cooking chamber 14.

As further shown in FIG. 3B, the upper lid portion 18 can include an upper heating element 38 disposed on an interior thereof. In the illustrated embodiment, the upper heating element 38 is disposed above the fan 30. The upper heating element 38 can be configured to operate in conjunction with the fan 30, such that the air circulated by the fan 30 in the hollow cooking chamber 14 is heated by the upper heating element 38, such that convection cooking operations can be performed by the cooking assembly 10. The upper lid portion can include a lid aperture 42 on an upper interior thereof that is configured to allow air to flow through the upper lid portion and into the hollow cooking chamber. A person skilled in the art will appreciate that the cooking system can include any number of fans and/or heating elements positioned at various locations.

As shown further in FIGS. 3B-3D, the upper lid portion 18 can include an exhaust port 18c located on a rear side thereof. The exhaust port 18c can be sized to allow for substantially the same rate of airflow to exit the hollow cooking chamber 14 as is entering the hollow cooking chamber 14 through a lid aperture 18d, which will be discussed in more detail below.

FIGS. 3A-3D further depict an exemplary embodiment of a smoke assembly 50 coupled to the upper lid portion 18 of the housing 12 on an external surface thereof. The smoke assembly 50, while shown in the exemplary embodiment to be disposed external to the hollow cooking chamber 14, is in fluid communication with the hollow cooking chamber 14 via a lid aperture 18d such that smoke generated by the smoke assembly 50 can flow into the hollow cooking chamber 14 to be used during cooking operations to impart flavor onto food products. Various embodiments of the smoke assembly 50 will be discussed in greater detail below with respect to FIGS. 4A-4F.

As further shown in FIGS. 3A-3B, 3E, and 3H, the lower base portion 16 can include a user interface 46 arranged thereon. In the illustrated embodiment, the user interface 46 includes a display 46a configured to depict information about the cooking assembly 10, as well as various inputs 46b in the form of buttons and dials. These inputs 46b can set and adjust cooking operations of the cooking assembly 10, and can involve altering any of the features of the assembly 10, including the upper and lower heating elements 38, 28, the fan 30, and the smoke assembly 50.

When actuated, a controller (not shown) coupled to the user interface 46 is configured to run one or more software programs installed in the cooking system 10. These software programs may be directed to preset cooking operations, a plurality of operations executed in combination, and/or interruption programs which adjust in-progress operations with inputs received to modify the operation, such as from a user via the user interface 46, or from an external source. The cooking operations to be executed in combination can be executed simultaneously and/or in succession.

FIGS. 4A-4F illustrate an exemplary embodiment of a smoke generator, such as a smoke assembly 50, that can be used in some implementations of the current subject matter. Generally, the smoke assembly 50 is configured to generate smoke for use in a cooking operation. The smoke assembly 50 can be mounted to an exterior surface of the upper lid portion 18 and is configured to be in fluid communication with the hollow cooking chamber 14 via a lid aperture 18d. The smoke assembly 50 can include a smoke assembly housing 52 having a generally rectangular configuration with top and bottom surfaces 52a, 52b, and four sides—narrower left and right sides 52c, 52d, and wider front and rear sides 52e, 52f—that together form an interior cavity 54. As shown in FIGS. 4A-4F, the front side 52e, proximate the housing 12, is formed to fit a contour of the outer surface of the upper lid portion 18, and therefore may be shorter than the rear side 52f. The rear side 52f, opposite the front side 52e, may include a first air intake 56a disposed at a lower region to allow air into the interior cavity 54. The top surface includes a lid 58 hinged to the smoke housing 52 that leads to the interior cavity 54. In some embodiments, the lid 58 is biased to a closed position via a spring 58a with enough force to prevent accidental opening, or to prevent excess air from seeping into the interior cavity 54. The interior cavity 54 is sized to receive an insertable removable fuel box assembly 60 therein. In some embodiments, the force exerted by spring 58a is large enough to prevent the fuel box assembly 60 from sliding out of the smoke assembly housing 52 when the upper lid portion 18 is in an open position.

The fuel box assembly 60 can be configured to receive and retain fuel for use during a cooking operation, and the fuel box assembly 60 can also catch and hold ash generated by combustion of the fuel. The fuel box assembly 60, seen within the smoke assembly housing 52 in FIG. 4C and removed from the smoke assembly housing 52 in FIG. 4F, includes left and right sidewalls 60a, 60b, and front and rear sidewalls 60c, 60d, which are wider than the left and right sidewalls 60a, 60b similar to the smoke assembly housing 52. The fuel box assembly 60 also includes a top surface 60e and a bottom surface 60f which extend between the sidewalls 60a-d at respective top and bottom ends. The particular shape and arrangement of the fuel box assembly 60 can vary in dimension, and certain features can be rounded or generally altered from what is depicted. The front sidewall 60c, disposed proximate the housing 52, is shown covered by a mesh 64 with a plurality of small apertures 62a disposed thereon. At an upper region of the front sidewall, beyond the mesh, the smoke assembly further includes a large aperture 62b. The particular amount and arrangement of apertures 62a, 62b can vary in number, arrangement, and/or dimension. The rear sidewall of the fuel box assembly 60 is substantially solid, except for at a lower region, which can contain a second air intake 56b that aligns with the first air intake 56a located on the rear sidewall of the smoke assembly housing 52. The first and second air intakes 56a, 56b define a portion of an airflow path through the cooking system 10.

The fuel box assembly 60 is further configured to be placed within the smoke assembly housing 52 to substantially conform with the left, right, and rear sides. A region near the front side of the smoke assembly housing 52 proximate the upper lid portion can be larger than a region occupied by the fuel box assembly 60, and is thus not filled by the fuel box assembly 60 when the fuel box assembly 60 is inserted into the smoke assembly housing 52. As shown in FIGS. 4A-4F, this region can contain an igniter 66, such as a wire heating element, that is configured to heat fuel contained in the fuel box assembly 60 through the smaller apertures 62a of the mesh 64 on the front fuel box assembly sidewall 60e. In various embodiments, the igniter 66 can take on various forms, such as, for example, a electrical tubular heating element or a sparking device. When smoke generation is required for a cooking operation, the igniter 66 can be powered on to ignite fuel contained in the fuel box assembly 60.

As further shown in FIGS. 4A-4F, the fuel box assembly 60 has an interior space. This interior space is divided into two regions, an upper region in the form of a pellet box 68 that is configured to receive and hold fuel for use during a smoke generation process, and a lower region in the form of an ash catcher 70 that is configured to receive and store ash created during a smoke generation process. The pellet box 68 and the ash catcher 70 are shown in the illustrated embodiment as being separated by a mesh divider 72. The mesh divider 72 includes apertures which are sized to be large enough to allow for ash to fall from the pellet box 68 to the ash catcher 70 during a smoke generation process, while also being small enough to prevent fuel from passing through the mesh divider 72. The ash catcher 70 is further configured to retain ash generated by the fuel box assembly 60, such that removal of the fuel box assembly 60 from the smoke assembly housing 52 will also remove ash from the smoke assembly housing 52 to facilitate disposal and prevent ash spillage. A person skilled in the art will appreciate that other techniques can be used to separate ash from the fuel.

In some embodiments, and as depicted in the FIGS. 4A-4F, the smoke assembly 50 can include a temperature sensor 74 disposed proximate to the fuel box assembly 60. The temperature sensor 74 can take on any suitable form, and, for example, may be one of a thermocouple, a resistance temperature detector (RTD), a thermistor, and a semiconductor based integrated circuit. However, any form of sensor capable of measuring temperature can be used. The temperature sensor 74 is configured to measure a temperature of the interior of the fuel box assembly 60 during smoke processes and non-smoke processes.

Figure 4A:
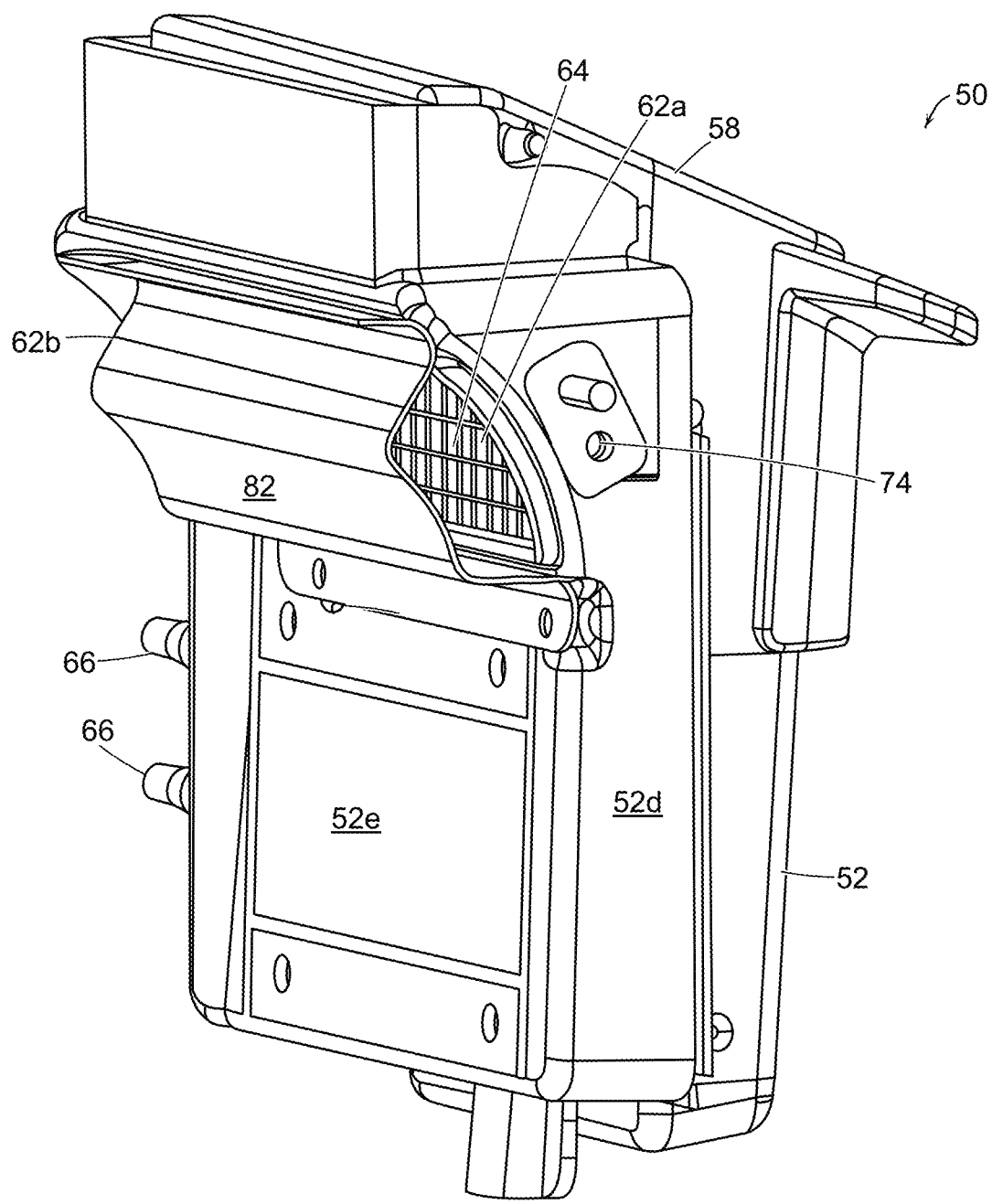
FIG. 4A is a side perspective view of the exemplary smoke assembly of FIG. 3A.
Figure 4B:
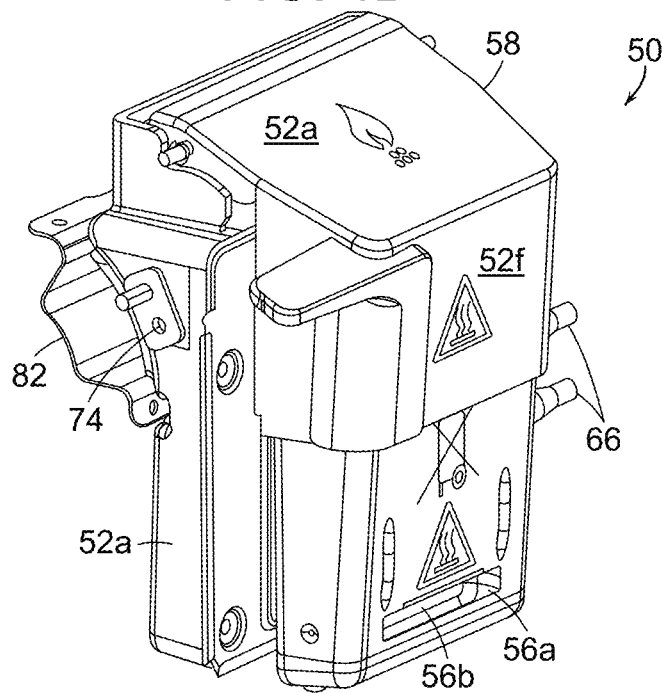
FIG. 4B is a rear perspective view of the smoke assembly of FIG. 4A.
Figure 4C:
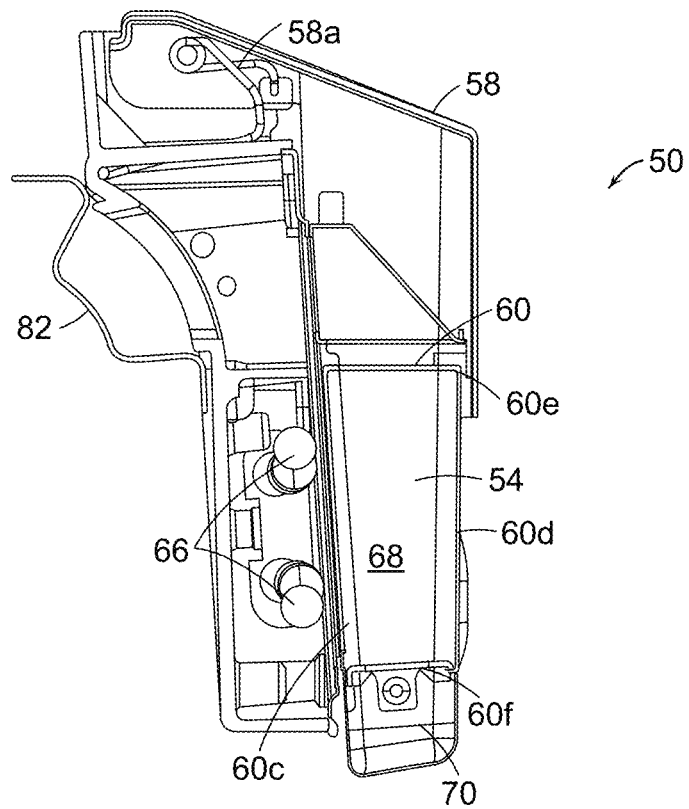
FIG. 4C is a side cross-sectional view of the smoke assembly of FIG. 4A.
Figure 4D:
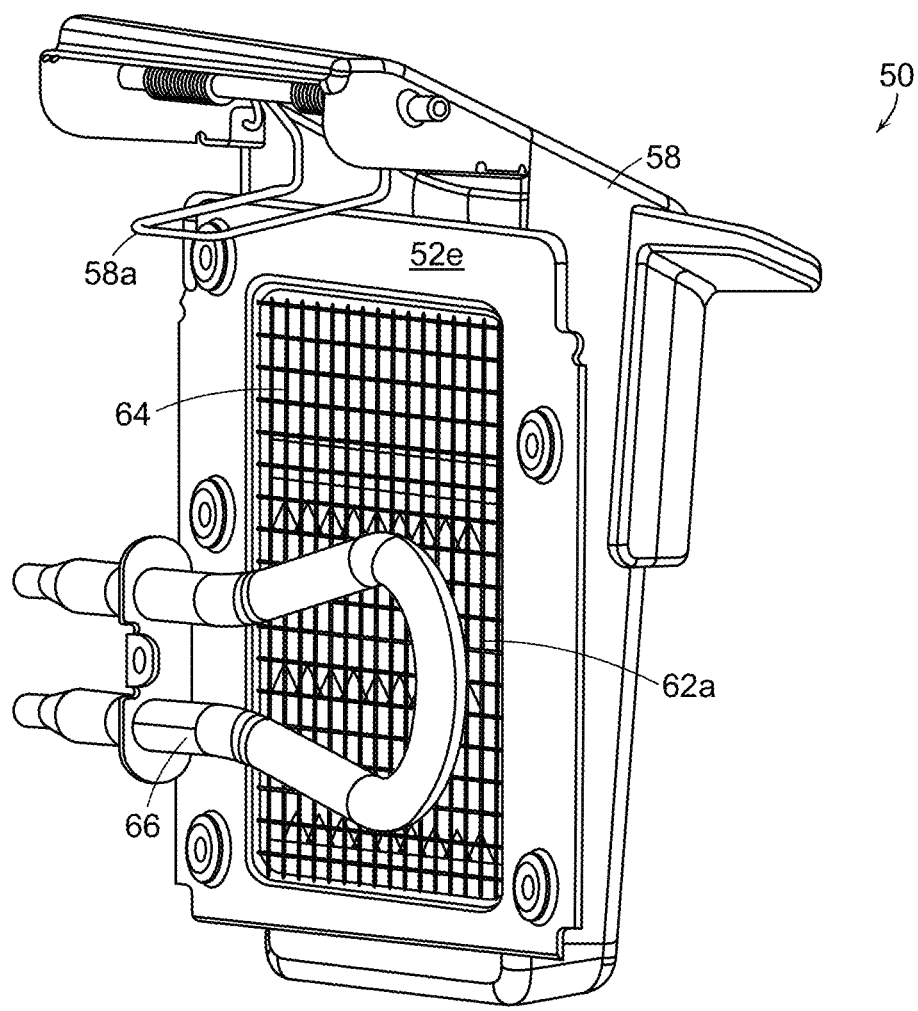
FIG. 4D is a partial cross-sectional view of the smoke assembly of FIG. 4A.
Figure 4E:
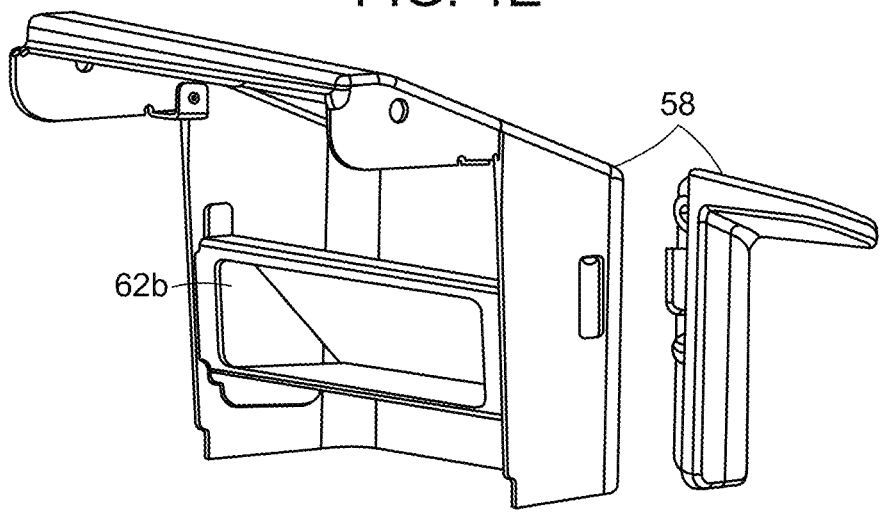
FIG. 4E is a side perspective view of a lid of the smoke assembly of FIG. 4A.
Figure 4F:
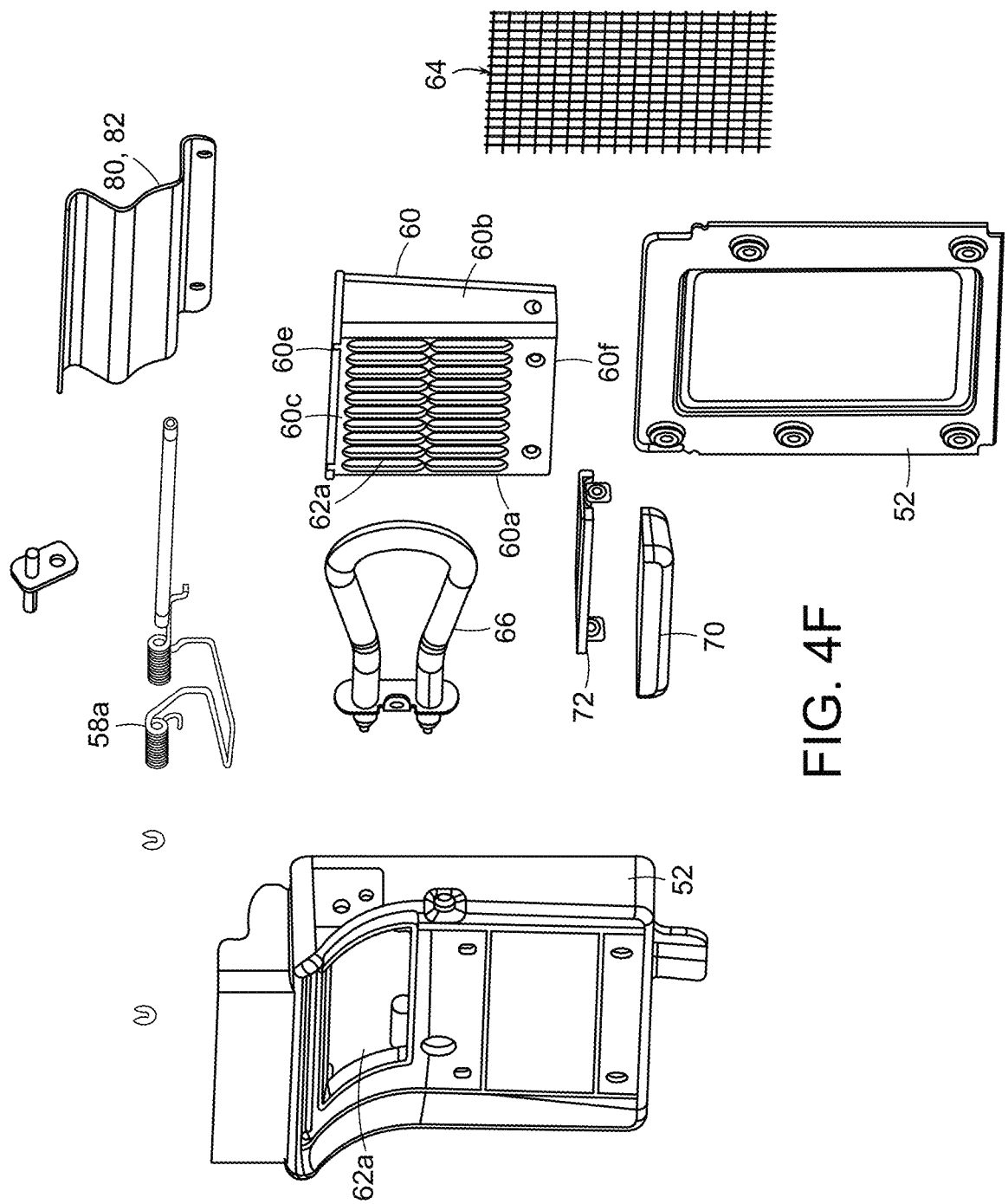
FIG. 4F is an exploded view of the smoke assembly of FIG. 4A.

The smoke assembly interior 54, including the interior of both the smoke assembly housing 52 and the fuel box assembly 60, are in fluid communication with the hollow cooking chamber 14. As mentioned previously, and as shown especially in FIG. 4C, the front sidewall of the smoke assembly 50, above the region containing the igniter 66, contains a large aperture 62b. The large aperture 62b defines part of the airflow pathway, joining the smoke assembly 50 interior with the hollow cooking chamber 14. Covering the large aperture 62b, as depicted in FIGS. 4A-4C, is a baffle 80 disposed in the airflow path. When the smoke assembly 50 is coupled to the housing 10 at the lid aperture 18d, the baffle 80 passes through the lid aperture 18d and is thereby positioned within the hollow cooking chamber 14.

In the embodiment shown in FIGS. 4A-4E, the baffle 80 is a tunnel baffle 82. The tunnel baffle 82 can include a cover 82c spanning the large aperture 62b that is oriented horizontally to align with a direction of airflow in the hollow cooking chamber 14. The cover 82c can include openings at each end thereof such that, in relation to airflow through the hollow cooking chamber 14, one opening is an upstream opening 82a and the other opening is a downstream opening 82b.

As mentioned above, the cooking assembly 10 is operated by a user interface 46 located on an exterior of the front side of the housing 12. The user interface 46 is coupled to a controller that coordinates operation of the various components of the cooking assembly 10 based on instructions received at the user interface 46, as well as based on inputs measured by various sensors within the cooking system. These cooking operations include conductive, convective, and radiative heating methods, such as grilling, baking, air frying, dehydrating, and other known cooking methods. Further, these cooking operations include methods relying on smoke generated by the smoke assembly 50. Smoke methods can include low-and-slow, perfume smoke, and variable fan speed. Any of the listed operations can be used in combination with one another, both in succession or at the same time.

In an exemplary embodiment, such as shown in FIGS. 3A, 3B, and 3F, the user interface 46 includes a smoke infusion input 46c, which can cause the smoke assembly 50 to generate smoke on-demand. The smoke infusion input 46c can be used with any other cooking operation as a means by which additional smoke flavor can be imparted onto a food product as desired. If smoke functionality is not already in use, actuation of the smoke infusion input 46c can cause the igniter 66 to ignite fuel stored in the pellet box 68. If smoke functionality is already in use, actuation of the smoke infusion input 46c can cause the fan 30 to draw more smoke into the hollow cooking chamber 14. In other embodiments, actuation of the smoke infusion input 46c can result in various changes to the cooking assembly 10 based on detected stimuli during a cooking operation, which result in the generation of more smoke for imparting cooking flavor onto a food product. For example, if a detected temperature in the smoke assembly 50 is low, indicating a weak ember, actuation of the smoke infusion input 46c may cause the fan 30 to increase a fan speed, thereby pulling more air through the airflow path to grow the ember and generate additional smoke. In these embodiments, the generation of smoke is the outcome, however the system can determine how to go about generating more smoke based on detected stimuli.

Figure 5:
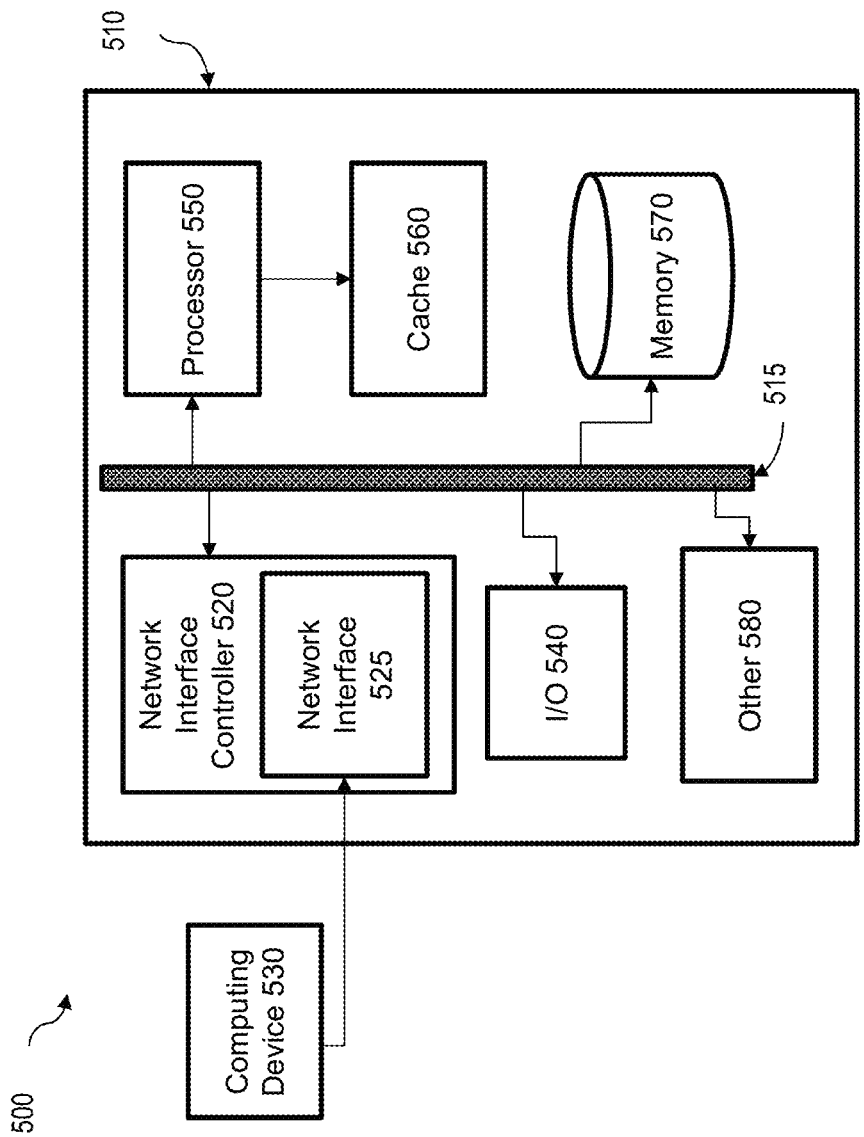
FIG. 5 is a block diagram of an exemplary computing system in accordance with an illustrative implementation of the current subject matter.

FIG. 5 is a block diagram 500 of a computing system 510 suitable for use in implementing the computerized components described herein. In broad overview, the computing system 510 includes at least one processor 550 for performing actions in accordance with instructions, and one or more memory devices 560 and/or 570 for storing instructions and data. The illustrated example computing system 510 includes one or more processors 550 in communication, via a bus 515, with memory 570 and with at least one network interface controller 520 with a network interface 525 for connecting to external devices 530, e.g., a computing device. The one or more processors 550 are also in communication, via the bus 515, with each other and with any I/O devices at one or more I/O interfaces 540, and any other devices 580. The processor 550 illustrated incorporates, or is directly connected to, cache memory 560. Generally, a processor will execute instructions received from memory. In some embodiments, the computing system 510 can be configured within a cloud computing environment, a virtual or containerized computing environment, and/or a web-based microservices environment.

In more detail, the processor 550 can be any logic circuitry that processes instructions, e.g., instructions fetched from the memory 570 or cache 560. In many embodiments, the processor 550 is an embedded processor, a microprocessor unit or special purpose processor. The computing system 510 can be based on any processor, e.g., suitable digital signal processor (DSP), or set of processors, capable of operating as described herein. In some embodiments, the processor 550 can be a single core or multi-core processor. In some embodiments, the processor 550 can be composed of multiple processors.

The memory 570 can be any device suitable for storing computer readable data. The memory 570 can be a device with fixed storage or a device for reading removable storage media. Examples include all forms of non-volatile memory, media and memory devices, semiconductor memory devices (e.g., EPROM, EEPROM, SDRAM, flash memory devices, and all types of solid state memory), magnetic disks, and magneto optical disks. A computing device 510 can have any number of memory devices 570.

The cache memory 560 is generally a form of high-speed computer memory placed in close proximity to the processor 550 for fast read/write times. In some implementations, the cache memory 560 is part of, or on the same chip as, the processor 550.

The network interface controller 520 manages data exchanges via the network interface 525. The network interface controller 520 handles the physical, media access control, and data link layers of the Open Systems Interconnect (OSI) model for network communication. In some implementations, some of the network interface controller's tasks are handled by the processor 550. In some implementations, the network interface controller 520 is part of the processor 550. In some implementations, a computing device 510 has multiple network interface controllers 620. In some implementations, the network interface 525 is a connection point for a physical network link, e.g., an RJ 45 connector. In some implementations, the network interface controller 520 supports wireless network connections and an interface port 525 is a wireless Bluetooth transceiver. Generally, a computing device 510 exchanges data with other network devices 530, such as computing device 530, via physical or wireless links to a network interface 525. In some implementations, the network interface controller 520 implements a network protocol such as LTE, TCP/IP Ethernet, IEEE 802.11, IEEE 802.16, Bluetooth, or the like.

The other computing devices 530 are connected to the computing device 510 via a network interface port 525. The other computing device 530 can be a peer computing device, a network device, a server, or any other computing device with network functionality. In some embodiments, the computing device 530 can be a network device such as a hub, a bridge, a switch, or a router, connecting the computing device 510 to a data network such as the Internet.

In some uses, the I/O interface 540 supports an input device and/or an output device (not shown). In some uses, the input device and the output device are integrated into the same hardware, e.g., as in a touch screen. In some uses, such as in a server context, there is no I/O interface 540 or the I/O interface 540 is not used. In some uses, additional other components 580 are in communication with the computer system 510, e.g., external devices connected via a universal serial bus (USB).

The other devices 580 can include an I/O interface 540, external serial device ports, and any additional co-processors. For example, a computing system 510 can include an interface (e.g., a universal serial bus (USB) interface, or the like) for connecting input devices (e.g., a keyboard, microphone, mouse, or other pointing device), output devices (e.g., video display, speaker, refreshable Braille terminal, or printer), or additional memory devices (e.g., portable flash drive or external media drive). In some implementations, an I/O device is incorporated into the computing system 510, e.g., a touch screen on a tablet device. In some implementations, a computing device 510 includes an additional device 580 such as a co-processor, e.g., a math co-processor that can assist the processor 550 with high precision or complex calculations.

Exemplary technical effects of the methods, systems, apparatuses, and non-transitory machine readable storage mediums described herein include, by way of non-limiting example, consistently optimized ignition of the fuel source, thereby resulting in optimized smoke output and consistent quality of smoke imparted into food during its preparation in a grill or other cooking system/device, and without requiring real-time, closed-loop feedback from the smoke generator during the ignition of the fuel source to provide an optimized smoke output. Some implementations of the open-loop ignition process described herein can provide a highly effective method of ensuring optimized ignition because it can circumvent the difficulties in sensing the presence and/or intensity of combustion by extracting key quantities from the physical ignition system to generate a model for the physical system that is accurate enough to provide consistent and optimal ignition. For example, variables such as ambient air temperature, weather, initial temperature of the ignition region, airflow through the ignition region, and igniter power can all be accounted for with relative precision by some implementations of the open-loop ignition process described herein. With one or more of these variables accounted for, the open-loop ignition process can essentially determine the energy input required to create the desired ignition output without requiring complicated sensor and/or design considerations required for closed loop control while ensuring optimized run-to-run ignition/smoke performance. As such, some implementations of the current subject matter can provide for consistent, reliable ignition performance without closed loop monitoring and control.

Certain exemplary implementations have been described to provide an overall understanding of the principles of the structure, function, manufacture, and use of the systems, devices, and methods disclosed herein. One or more examples of these implementations have been illustrated in the accompanying drawings. Those skilled in the art will understand that the systems, devices, and methods specifically described herein and illustrated in the accompanying drawings are non-limiting exemplary implementations and that the scope of the present invention is defined solely by the claims. The features illustrated or described in connection with one exemplary implementation may be combined with the features of other implementations. Such modifications and variations are intended to be included within the scope of the present invention. Further, in the present disclosure, like-named components of the implementations generally have similar features, and thus within a particular implementation each feature of each like-named component is not necessarily fully elaborated upon.

The subject matter described herein can be implemented in analog electronic circuitry, digital electronic circuitry, and/or in computer software, firmware, or hardware, including the structural means disclosed in this specification and structural equivalents thereof, or in combinations of them. The subject matter described herein can be implemented as one or more computer program products, such as one or more computer programs tangibly embodied in an information carrier (e.g., in a machine readable storage device), or embodied in a propagated signal, for execution by, or to control the operation of, data processing apparatus (e.g., a programmable processor, a computer, or multiple computers). A computer program (also known as a program, software, software application, or code) can be written in any form of programming language, including compiled or interpreted languages, and it can be deployed in any form, including as a standalone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processor of any kind of digital computer. Generally, a processor will receive instructions and data from a read only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. Information carriers suitable for embodying computer program instructions and data include all forms of non-volatile memory, including by way of example semiconductor memory devices, (e.g., EPROM, EEPROM, and flash memory devices); magnetic disks, (e.g., internal hard disks or removable disks); magneto optical disks; and optical disks (e.g., CD and DVD disks). The processor and the memory can be supplemented by, or incorporated in, special purpose logic circuitry.

To provide for interaction with a user, the subject matter described herein can be implemented on a computer having a display device, e.g., a CRT (cathode ray tube) or LCD (liquid crystal display) monitor, for displaying information to the user and a keyboard and a pointing device, (e.g., a mouse or a trackball), by which the user can provide input to the computer. Other kinds of devices can be used to provide for interaction with a user as well. For example, feedback provided to the user can be any form of sensory feedback, (e.g., visual feedback, auditory feedback, or tactile feedback), and input from the user can be received in any form, including acoustic, speech, or tactile input.

The techniques described herein can be implemented using one or more modules. As used herein, the term "module" refers to computing software, firmware, hardware, and/or various combinations thereof. At a minimum, however, modules are not to be interpreted as software that is not implemented on hardware, firmware, or recorded on a non-transitory processor readable recordable storage medium (i.e., modules are not software per se). Indeed "module" is to be interpreted to always include at least some physical, non-transitory hardware such as a part of a processor or computer. Two different modules can share the same physical hardware (e.g., two different modules can use the same processor and network interface). The modules described herein can be combined, integrated, separated, and/or duplicated to support various applications. Also, a function described herein as being performed at a particular module can be performed at one or more other modules and/or by one or more other devices instead of or in addition to the function performed at the particular module. Further, the modules can be implemented across multiple devices and/or other components local or remote to one another. Additionally, the modules can be moved from one device and added to another device, and/or can be included in both devices.

The subject matter described herein can be implemented in a computing system that includes a back end component (e.g., a data server), a middleware component (e.g., an application server), or a front end component (e.g., a client computer having a graphical user interface or a web browser through which a user can interact with an implementation of the subject matter described herein), or any combination of such back end, middleware, and front end components. The components of the system can be interconnected by any form or medium of digital data communication, e.g., a communication network. Examples of communication networks include a local area network ("LAN") and a wide area network ("WAN"), e.g., the Internet.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

One skilled in the art will appreciate further features and advantages of the invention based on the above-described implementations. Accordingly, the present application is not to be limited by what has been particularly shown and described, except as indicated by the appended claims. All publications and references cited herein are expressly incorporated by reference in their entirety.

The invention claimed is:

1. A cooking system, comprising:
    a housing including a cooking chamber therein and a smoker box in fluidic communication with the cooking chamber, the smoker box comprising a fuel source and an igniter adjacent to the fuel source;
    at least one sensor; and
    a controller operably coupled to the igniter and the at least one sensor, the controller comprising a memory and a data processor configured to execute instructions stored in the memory, which when executed cause the data processor to perform operations comprising
        receiving data characterizing an instruction activating the igniter, the instruction corresponding to a selection of an operating mode of the smoker box;
        determining, based on the data, a first amount of energy to be output by the igniter to ignite the fuel source;

causing, based on the data, electric current to be conveyed to the igniter so as to activate the igniter to output the first amount of energy and ignite the fuel source;

determining an amount of electric current conveyed to the igniter during a period of time the igniter is activated;

determining a second amount of energy to be output by the igniter over the period of time the igniter is activated based on the determined amount of amount of electric current conveyed during the period of time the igniter is activated;

determining whether the second amount of energy exceeds the first amount of energy; and causing the igniter to deactivate based on determining the second amount of energy exceeds the first amount of energy.

2. The cooking system of claim 1, wherein the temperature data includes a temperature of the smoker box, a temperature of the cooking system, and/or an ambient temperature of air in proximity of the smoker box.

3. The cooking system of claim 2, wherein the temperature of the smoker box is acquired via a first sensor in fluid communication with air inside a compartment of the smoker box.

4. The cooking system of claim 2, wherein the temperature of the cooking system is acquired via a second sensor in fluid communication with air inside a chamber within the cooking system, the chamber configured to cook food within the cooking system.

5. The cooking system of claim 2, wherein the ambient temperature of air in proximity of the smoker box is acquired via a third sensor in fluid communication with air surrounding the smoker box.

6. The cooking system of claim 1, wherein the amount of electric current is conveyed to the igniter at one or more time points during the period of time the igniter is activated.

7. The cooking system of claim 1, wherein the amount of electric current is inversely related to the temperature of the cooking system.

8. The cooking system of claim 1, wherein the second amount of energy is further determined based on a nominal electrical resistance of a nominal igniter corresponding to the igniter.

9. The cooking system of claim 8, wherein the second amount of energy is determined to increase based on a decrease in the nominal electrical resistance of the nominal igniter corresponding to the igniter.

10. The cooking system of claim 1, wherein the second amount of energy is determined to increase based on an increase in the determined amount of electric current conveyed during the period of time the igniter is activated.

11. The cooking system of claim 1, wherein the period of time the igniter is activated comprises a plurality of time periods, and the second amount of energy can be a cumulative amount of second energy corresponding to the second amount of energy determined for each time period of the plurality of time periods.

12. A smoke assembly comprising:
a fuel box assembly configured to retain a fuel source therein;
an igniter adjacent to the fuel source;
at least one sensor; and
a controller operably coupled to the igniter and the sensor, the controller comprising at a memory and a data processor configured to execute instructions stored in the memory, which when executed cause the data processor to perform operations comprising
receiving data characterizing an instruction activating the igniter, the instruction corresponding to a selection of an operating mode of the smoke assembly;
determining, based on the data, a first amount of energy to be output by the igniter to ignite the fuel source;
causing, based on the data, electric current to be conveyed to the igniter so as to activate the igniter to output the first amount of energy and ignite the fuel source;
determining an amount of electric current conveyed to the igniter during a period of time the igniter is activated;
determining a second amount of energy to be output by the igniter over the period of time the igniter is activated based on the determined amount of amount of electric current conveyed during the period of time the igniter is activated;
determining whether the second amount of energy exceeds the first amount of energy; and
causing the igniter to deactivate based on determining the second amount of energy exceeds the first amount of energy.

13. The smoke assembly of claim 12, wherein the temperature data includes a temperature of the smoke assembly, and/or an ambient temperature of air in proximity of the smoke assembly.

14. The smoke assembly of claim 13, wherein the at least one sensor is a first sensor in fluid communication with air inside a compartment of the smoke assembly and the first sensor is configured to acquire the temperature of the smoke assembly.

15. The smoke assembly of claim 13, wherein the at least one sensor is a second sensor in fluid communication with air surrounding the smoke assembly and the second sensor is configured to acquire the ambient temperature of air in proximity of the smoke assembly.

16. The smoke assembly of claim 12, wherein the amount of electric current is conveyed to the igniter at one or more time points during the period of time the igniter is activated.

17. The smoke assembly of claim 12, wherein the amount of electric current is inversely related to the temperature of the smoke assembly.

\* \* \* \* \*